United States Patent
Takahashi et al.

(10) Patent No.: US 6,723,583 B2
(45) Date of Patent: Apr. 20, 2004

(54) METHOD OF MANUFACTURING A SEMICONDUCTOR DEVICE USING A MOLD

(75) Inventors: Noriyuki Takahashi, Yonezawa (JP); Masayuki Suzuki, Nanyo (JP); Kouji Tsuchiya, Kaminoyama (JP); Takao Matsuura, Kawanishi (JP); Takanori Hashizume, Higashiyamoto (JP); Masahiro Ichitani, Kodaira (JP); Kazunari Suzuki, Tokyo (JP); Takafumi Nishita, Iruma (JP); Kenichi Imura, Higashiyamoto (JP); Takashi Miwa, Fussa (JP)

(73) Assignees: Renesas Technology Corp., Tokyo (JP); Hitachi ULSI Systems Co. Ltd., Tokyo (JP); Hitachi Yonezawa Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/453,606

(22) Filed: Jun. 4, 2003

(65) Prior Publication Data

US 2003/0205797 A1 Nov. 6, 2003

Related U.S. Application Data

(63) Continuation of application No. 09/987,532, filed on Nov. 15, 2001, now Pat. No. 6,596,561.

(30) Foreign Application Priority Data

Dec. 20, 2000 (JP) .................................. 2000-387825

(51) Int. Cl.[7] .............................................. H01L 21/44
(52) U.S. Cl. ...................................... 438/114; 438/465
(58) Field of Search ............................... 438/112, 113, 438/114, 118, 124, 127, 465

(56) References Cited

U.S. PATENT DOCUMENTS

| 5,776,798 | A | | 7/1998 | Quan et al. ............... 438/112 |
| 5,904,502 | A | | 5/1999 | Ference .................... 438/118 |
| 5,914,531 | A | * | 6/1999 | Tsunoda et al. .......... 257/668 |
| 6,228,684 | B1 | * | 5/2001 | Maruyama ................ 438/118 |

(List continued on next page.)

FOREIGN PATENT DOCUMENTS

| EP | 0 853 337 | 7/1998 |
| EP | 0 971 401 | 1/2000 |
| JP | 7-321248 | 12/1995 |
| JP | 10-244556 | 9/1998 |
| JP | 10-256286 | 9/1998 |
| JP | 11-16930 | 1/1999 |
| JP | 2000-12578 | 1/2000 |
| JP | 2000-138246 | 5/2000 |

OTHER PUBLICATIONS

English–Language Translation of JP 2000–138246, Published May 16, 2000, Patent Abstracts of Japan.

*Primary Examiner*—Chanda Chaudhari
(74) *Attorney, Agent, or Firm*—Mattingly, Stanger & Malur, P.C.

(57) ABSTRACT

The back side of a strip substrate with plural semiconductor chips mounted thereon is vacuum-chucked to a lower mold half of a mold, and in this state the plural semiconductor chips are sealed with resin simultaneously to form a seal member. Thereafter, the strip substrate and the seal member are released from the mold and are cut into plural semiconductor devices. The semiconductor devices thus obtained are improved in their mounting reliability.

22 Claims, 41 Drawing Sheets

U.S. PATENT DOCUMENTS

| | | | |
|---|---|---|---|
| 6,245,595 B1 | 6/2001 | Nguyen et al. | 438/108 |
| 6,287,895 B1 * | 9/2001 | Sato | 438/114 |
| 6,329,220 B1 | 12/2001 | Bolken et al. | 438/127 |
| 6,333,564 B1 * | 12/2001 | Katoh et al. | 438/118 |
| 6,346,433 B1 | 2/2002 | Maeda et al. | 438/127 |
| 6,358,776 B1 | 3/2002 | Takehara et al. | 438/114 |
| 2001/0003049 A1 | 6/2001 | Fukasawa et al. | 438/127 |
| 2002/0089062 A1 | 7/2002 | Saran et al. | 257/759 |

* cited by examiner

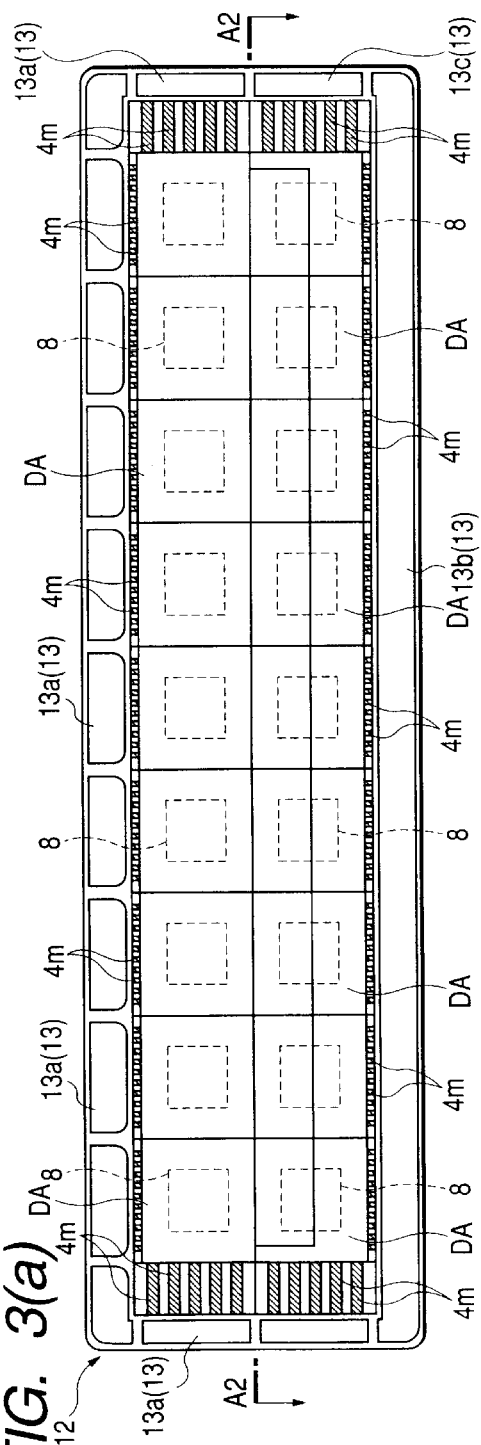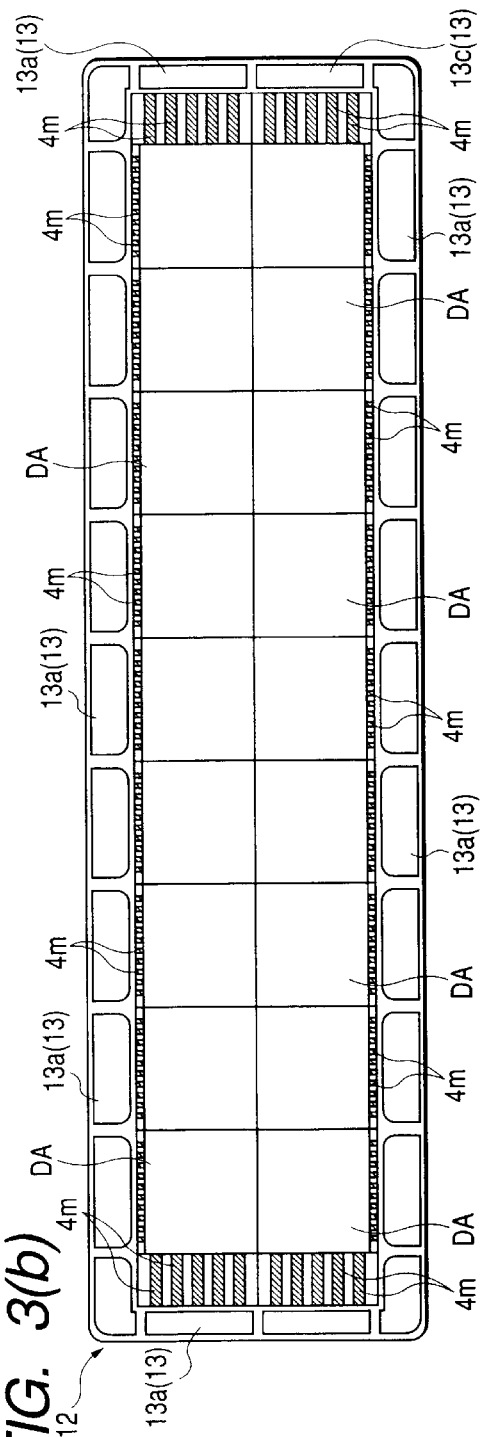

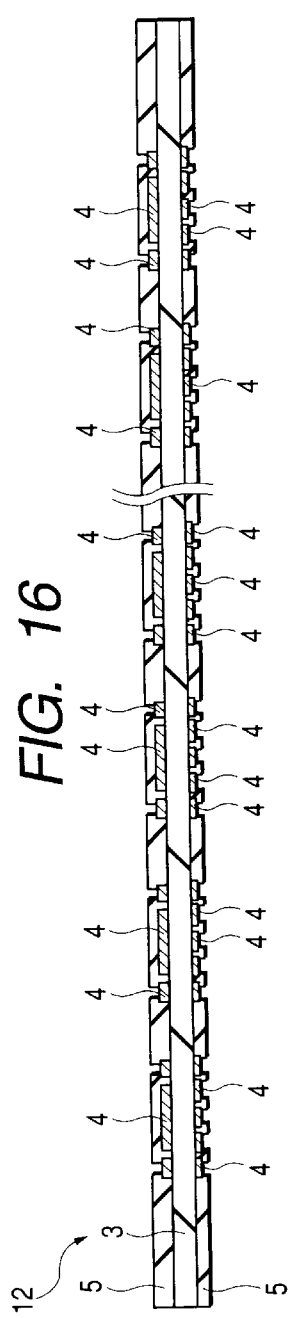
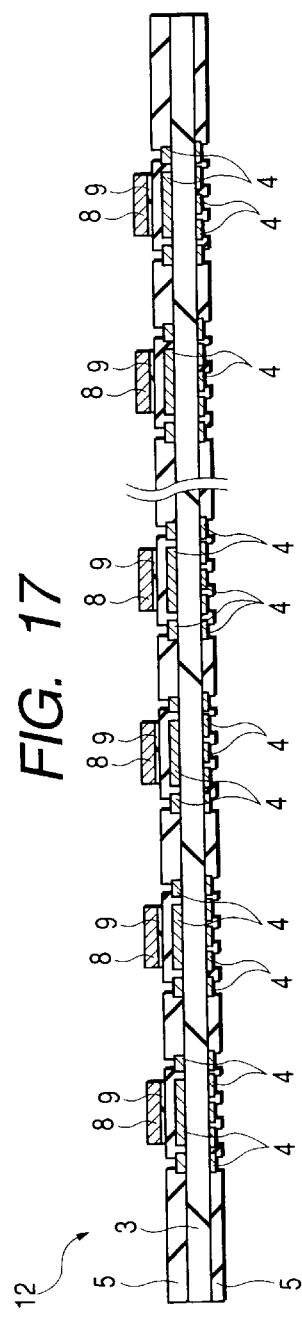
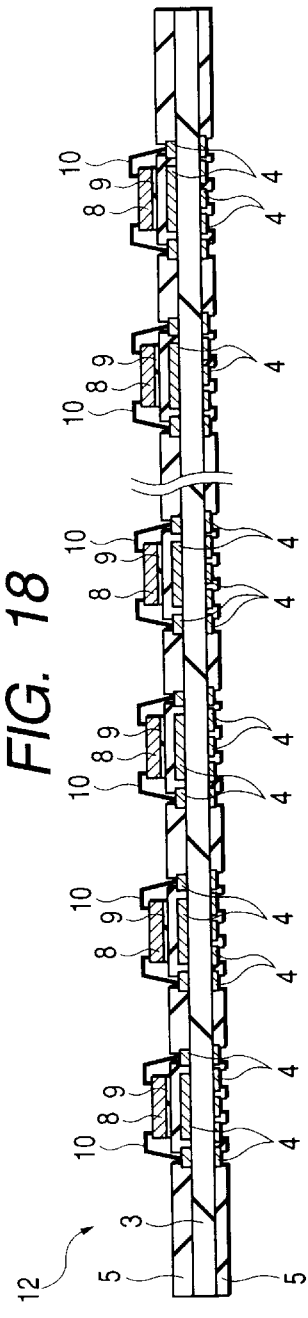

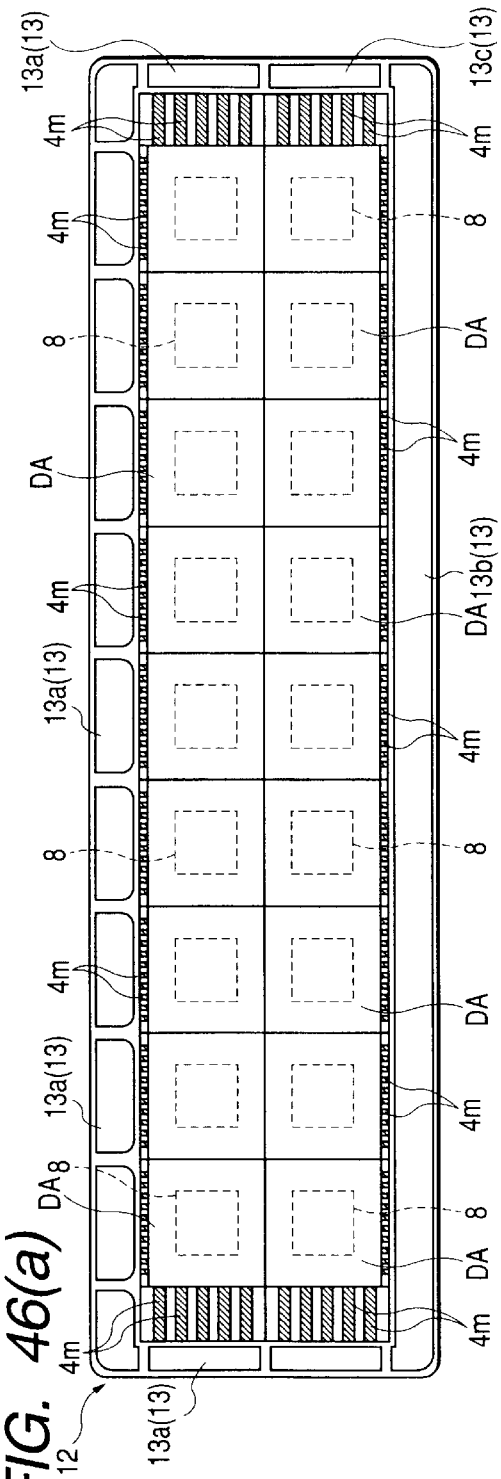
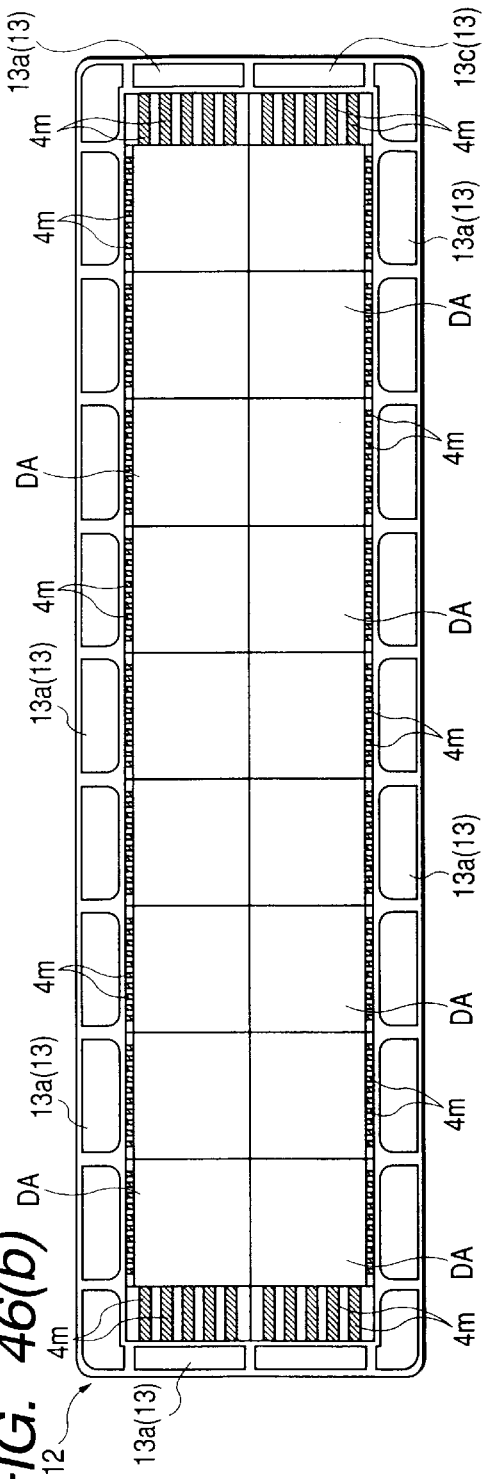

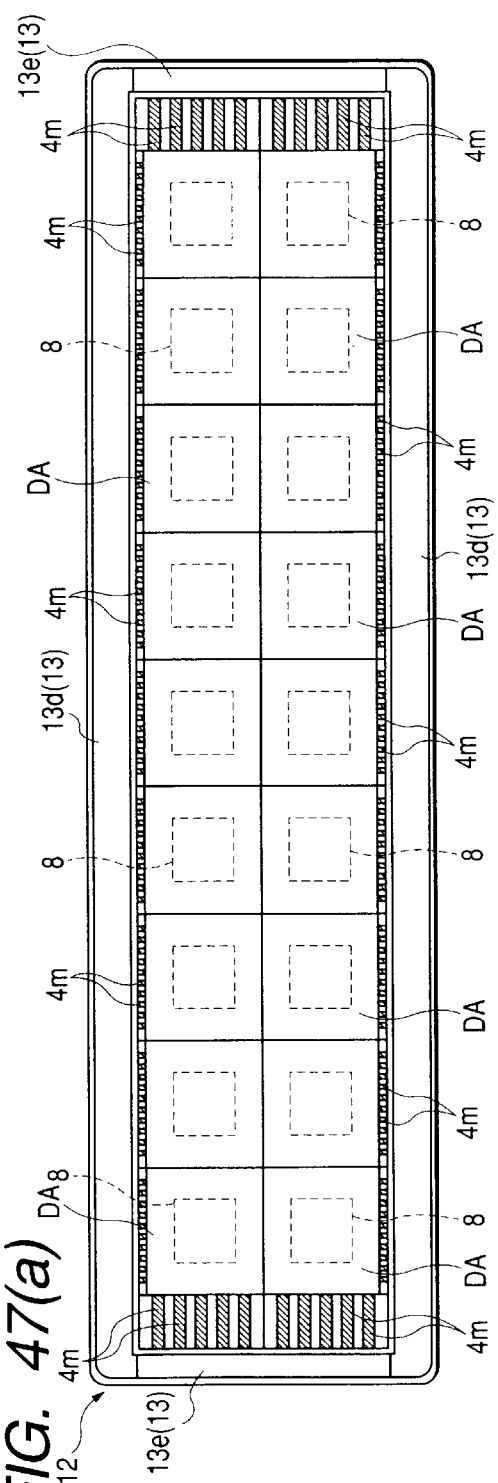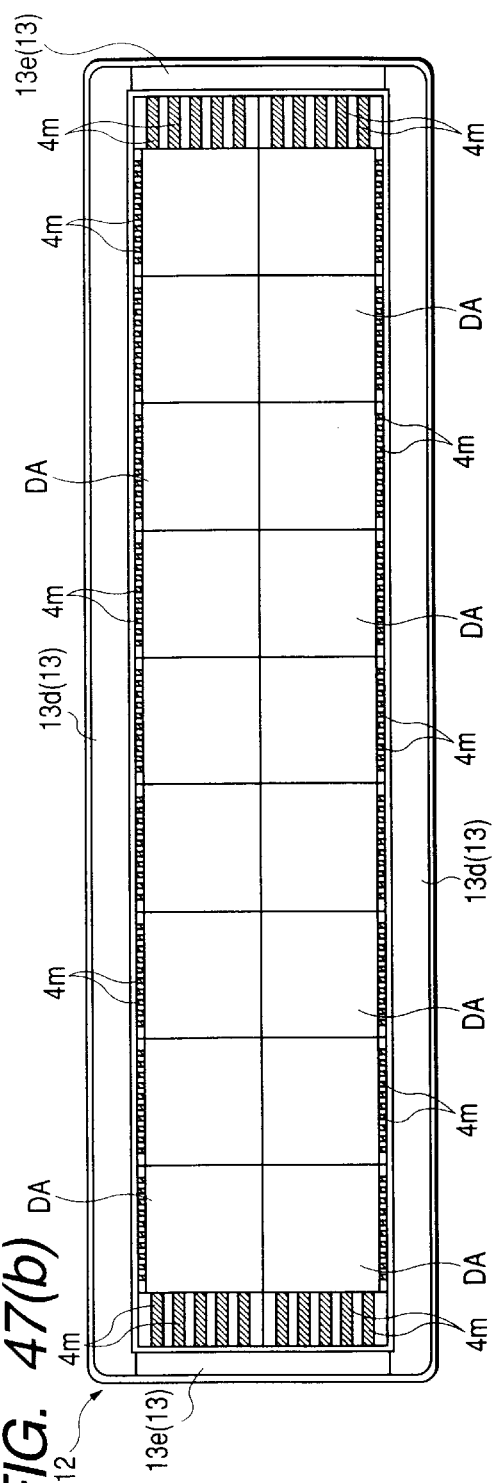

METHOD OF MANUFACTURING A SEMICONDUCTOR DEVICE USING A MOLD

This is a continuation application of U.S. Ser. No. 09/987,532, now U.S. Pat. No. 6,596,561, filed Nov. 15, 2001.

BACKGROUND OF THE INVENTION

The present invention relates to a semiconductor device manufacturing method and a semiconductor technique. Particularly, the invention is concerned with a technique which is effective in its application to a semiconductor device having a small-sized package structure.

A CSP (Chip Size Package) or the like having an external package size almost equal to or slightly larger than that of a semiconductor chip permits a high-density packaging corresponding to bare chip packaging and is relatively low in its manufacturing cost. With these advantages, there is now an increasing demand for CSP in the field of small-sized, light-weight electronic devices such as portable information devices, digital cameras, and notebook type personal computers.

In connection with the CSP, various package forms are available. But there generally is adopted a Ball Grip Array (BGA) structure wherein solder bumps are attached to one side of a package substrate with a semiconductor chip mounted thereon and are reflow-soldered to a surface of a printed wiring board. Particularly, in the case of a thin multi-pin CSP, a TCP (Tape Carrier Package) type BGA (tape BGA) is most popular wherein a package substrate with a semiconductor chip mounted thereon is constituted by such an insulating tape as a polyimide tape. As to the TCP using an insulating tape as a package substrate, it is disclosed, for example, in Japanese Published Unexamined Patent Application No. Hei 7(1995)-321248.

SUMMARY OF THE INVENTION

However, the present inventor has found out that the following problems are involved in the above CSP technique using an insulating tape as a package substrate.

The problem is that it is difficult to apply the CSP technique to products for which high reliability is required. For example, this is because in the CSP structure using an insulating tape as a package substrate it is inevitably required that the temperature cyclicity after packaging be set lower than the user's request, which may be attributable to the material of the package substrate being polyimide, thus making it impossible to attain a further improvement of reliability.

The second problem is that the semiconductor device manufacturing cost is high. For example, this is because the polyimide tape as the material of the package substrate is expensive. Another reason is that in the manufacture of a CSP using an insulating tape as a package substrate, each individual semiconductor chip is sealed and that therefore the number of products obtained per unit area is small, thus leading to a high basic unit price.

In connection with the present invention the present inventor has searched prior art literatures from the standpoint of mold. As a result, for example in Japanese Published Unexamined Patent Application No. Hei 10(1998)-256286 there was found to be disclosed a technique wherein a coating layer is formed on an inner surface of a mold to effect mold release smoothly. In Japanese Published Unexamined Patent Application No. Hei 10(1998)-244556 is disclosed a technique of molding a resin package in a closely contacted state of a release film with an inner surface of a mold in order to facilitate removal of the resin package from the mold. In Japanese Published Unexamined Patent Application No. Hei 11(1999)-16930 is disclosed a technique of evacuating sheet to prevent creasing of the sheet at the time of molding using the sheet. In Japanese Published Unexamined Patent Application No. 2000-12578 is disclosed a technique of performing a transfer molding while mounting a large number of chips on a substrate. Further, in Japanese Published Unexamined Patent Application No. 2000-138246 is disclosed a mold of high versatility with an ejector pin attached thereto for each plural blocks.

It is an object of the present invention to provide a technique capable of improving the reliability of a semiconductor device.

It is another object of the present invention to provide a technique capable of reducing the cost of a semiconductor device.

The above and other objects and novel features of the present invention will become apparent from the following description and the accompanying drawings.

Out of the inventions disclosed herein, typical ones will be outlined below.

According to the present invention, a first substrate with plural semiconductor chips mounted on a first surface thereof is set within a mold, a film is interposed between an upper mold half of the mold and the first surface of the first substrate, the film is then vacuum-chucked to the upper mold, then in this state the plural semiconductor chips are together sealed with resin to form a seal member, and thereafter the first substrate and the seal member both released from the mold with use of the film cut into plural semiconductor devices.

According to the present invention, a first substrate with plural semiconductor chips mounted on a first surface thereof is set within a mold, a second surface lying on the back of the first surface of the first substrate is vacuum-chucked to a lower mold half of the mold, then in this state the plural semiconductor chips are together sealed with resin to form a seal member, and thereafter the first substrate and the seal member both released from the mold are cut into plural semiconductor devices.

According to the present invention, plural semiconductor chips mounted on a first main surface of a first substrate having a structure highly resistant to a thermal stress are together sealed to form a seal member, the seal member is then released from a mold used, and thereafter the first substrate and the seal member both released from the mold are cut into plural semiconductor devices.

According to the present invention, the above first substrate is constituted mainly by an insulating material of the same type as that used for a second substrate on which is mounted the first substrate.

According to the present invention, the above first substrate is constituted mainly by an insulating material equal in thermal expansion coefficient to a second substrate on which is mounted the first substrate.

According to the present invention, the above first and second substrates are constituted mainly by a glass-epoxy resin-based insulating material.

BRIEF DESCRIPTION OF THE DRAWINGS

FIG. 3(a) is a plan view of a main surface of a strip substrate used in a manufacturing process for the manufacture of the semiconductor device shown in FIG. 1 and FIG. 3(b) is a plan view of a back side of FIG. 3(a);

FIG. 16 is a sectional view of a strip substrate used in a semiconductor device manufacturing process embodying the present invention;

FIG. 17 is a sectional view of the strip substrate being processed in a step which follows FIG. 16;

FIG. 18 is a sectional view of the strip substrate being processed in a step which follows FIG. 17;

FIG. 46(a) is a plan view of a main surface of a strip substrate in a modified example according to the present invention which strip substrate is used in the manufacture of the semiconductor device shown in FIG. 1 and FIG. 46(b) is a plan view of a back side of FIG. 46(a); and FIG. 47(a) is a plan view of a main surface of a strip substrate in a further modified example according to the present invention which strip substrate is used in the manufacture of the semiconductor device shown in FIG. 1 and FIG. 47(b) is a plan view of a back side of FIG. 47(a).

DETAILED DESCRIPTION OF PREFERRED EMBODIMENTS

Figure 1:
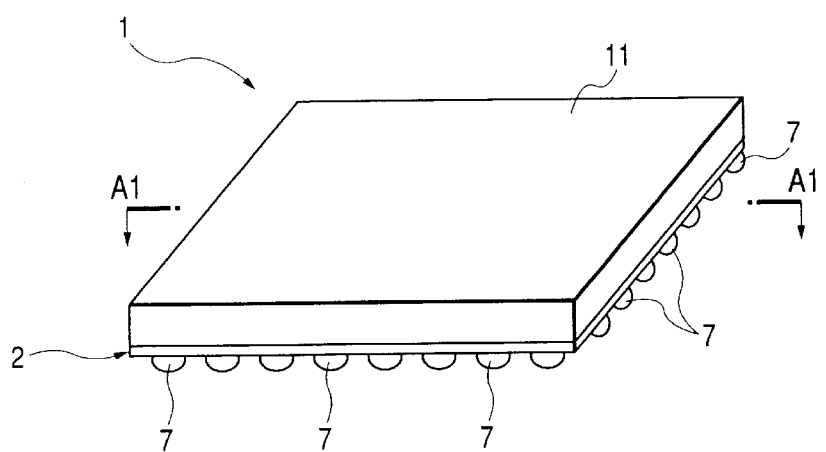
FIG. 1 is a perspective view of a semiconductor device embodying the present invention.

Before describing the present invention in detail, the meanings of terms as used herein will be explained below.

Temperature Cycle Test: This indicates a test involving exposing a semiconductor device to be tested to high and low temperatures repeatedly, causing changes in size and other physical properties, and determining operation characteristics and durability of physical damages.

For convenience' sake, a main surface (chip mounting surface, first surface) of a strip substrate (first substrate) and a back side (package mounting surface, second surface) thereof are classified into the following areas. An area in which a semiconductor device is formed is designated a "semiconductor device forming area," an entire area in which a group of such semiconductor device forming areas is arranged is designated a "product area (first area)," and an area extending along an outer periphery of the product area is designated a "peripheral area (second area)."

Where required for convenience' sake, the following embodiments will be described in a divided form into plural sections or modes, but unless otherwise indicated, they are not unrelated to one another, but are related such that one is a modification or a detailed or supplementary explanation of another.

As to the number of elements (including the number of elements, numerical values, quantities and ranges) to be referred to in the following description, no limitation is made to such specific numbers, but even larger or smaller numbers than the specific numbers may also be adopted unless otherwise indicated or except the case where limitation is made to the specific numbers basically and obviously.

In the following embodiments it goes without saying that related components (including component steps) are not always essential except the case where they are specified to be essential and the case where they are considered essential basically obviously.

Likewise, as to the shapes and positional relations of components referred to in the following embodiments, it is to be understood that there also are included shapes and positional relations similar or closely similar to them unless otherwise specified or unless otherwise considered basically obviously.

In all of the drawings for explaining the embodiments, portions having the same functions are identified by the same reference numerals, and repeated explanations thereof will be omitted.

Among the drawings related to the embodiments there are included those wherein hatching is used for making them easier to see even if they are plan views.

Embodiments of the present invention will be described in detail hereinunder with reference to the accompanying drawings.

(First Embodiment)

Figure 2:
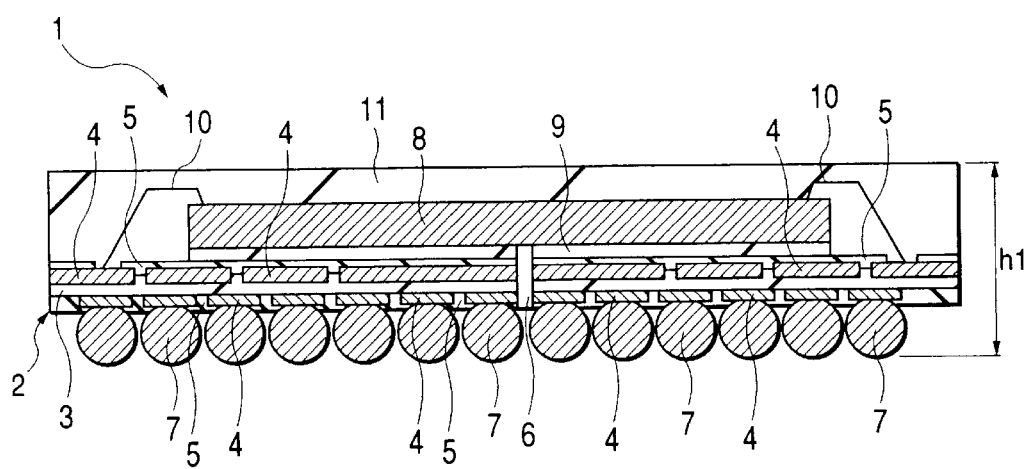
FIG. 2 is a sectional view taken on line A1—A1 in FIG. 1.

FIG. 1 is a perspective view of a semiconductor device embodying the present invention and FIG. 2 is a sectional view taken on line A1—A1 in FIG. 1.

The semiconductor device of this embodiment, indicated at 1, has, for example, an FBGA (Fine Pitch Ball Grid Array) structure. A package substrate 2 of the semiconductor device 1 is formed, for example, by a thin plate which is square in plan. The package substrate 2 comprises a substrate body 3, conductor patterns 4 and solder resist 5 both formed on a main surface (chip mounting surface) of the substrate body 3 and a back side (package mounting surface) thereof, a vent hole formed through both main surface and back side of the package substrate 2, and bump electrodes 7 bonded to the conductor patters 4 formed on the back side of the package substrate 2.

In this embodiment, as the material of the substrate 3 there is used a single-layer plate of a glass-epoxy resin equivalent to FR-5 which is high in heat resistance for example. By thus adopting a single-layer plate of an inexpensive glass-epoxy resin as the material of the substrate body 3 it is possible to minimize the manufacturing cost of the semiconductor device 1, that is, the cost of the semiconductor device 1 can be reduced.

Moreover, by using as the material of the substrate body 3 the same glass-epoxy resin as that of a printed wiring board which is generally employed as a substrate for mounting the semiconductor device 1, it is possible to relax a stress imposed on the bump electrodes 7 of the semiconductor device 1 which is attributable to a difference in thermal expansion coefficient between the package substrate 2 and the printed wiring board. Consequently, it is possible to improve the reliability after mounting of the semiconductor device 1.

Further, in comparison with the case where the substrate body 3 is constructed by a polyimide tape or the like, the temperature cyclicity in the temperature cycle test can be improved twice as much or more and therefore the semiconductor device 1 can be applied not only to portable devices and commercial uses but also to products for which high reliability is required such as industrial devices and automobile-related products.

However, the material of the substrate body 3 is not limited thereto, but various changes may be made. For example, there may be used an organic insulating material such as BT resin or aramid non-woven fabric. Even if any such material is used, there will be obtained the same effect as that obtained by using the foregoing glass-epoxy resin. Besides, in case of selecting BT resin as the material of the substrate body 3, it is possible to improve the heat radiating property because it is high in thermal conductivity.

The conductor patterns 4 on the package substrate 2 are formed, for example, by a simple two-layer structure, whereby the manufacturing cost of the semiconductor device 1 can be kept to a minimum and hence the cost thereof can be reduced. In this embodiment, the conductor patterns 4 involve two types of patterns which are patterns for wiring and patterns for dummy. Further, the conductor patterns 4 involve not only general line patterns but also wide patterns to which are bonded bump electrodes 7, bonding wires, or through holes. Conductor patterns 4 for wiring formed on both main surface and back side of the package substrate 2 are electrically connected with each other through through-holes which are formed through the main surface and the back side of the package substrate 2. Such conductor patterns 4 for wiring and for dummy are formed by etching a conductor film, e.g., electrolytic copper foil (or rolled copper foil), affixed to the main surface (chip mounting surface) and back side (package mounting surface) of the substrate body 3. Their surfaces are plated with, for example, nickel (Ni) or gold (Au). The reason why the conductor patterns 4 for dummy are provided is because it is intended to enhance the density of conductor patterns 4 on both main surface and back side of the package substrate 2. As to this point, a description will be given later.

The main surface and the back side of the package substrate 2 are coated with solder resist (insulating film) 5. Part of the solder resist 5 is removed, allowing part of the conductor patterns 4 to be exposed. The solder resist 5, which is also called solder mask or stop-off, is a heat-resisting coating material applied to specific areas on the main surface and the back side of the package substrate 2 and it is a resist to prevent solder from being affixed thereto in a soldering work. A main function of the solder resist 5 is to prevent conductor patterns 4 not to be soldered from contacting molten solder at the time of soldering and serve as a protective film for protecting the conductor patterns 4 other than soldered portions. The solder resist 5 also functions to prevent solder bridge between conductors, protect from stain and moisture, prevent damage, provide resistance to environment, prevent migration, ensure circuit-to-circuit insulation, and prevent short-circuit between circuits and other components (semiconductor chip (hereinafer referred to simply as "chip") and printed wiring board). Therefore, the solder resist 5 is constituted by an insulating material having these functions. In this embodiment, as the material of the solder resist 5 there are used an epoxy resin and an acrylic resin taking their thermal expansion coefficients into account. In this embodiment the solder resist 5 is coated so that the state of coating (e.g., area and thickness of the coating) is almost uniform on both main surface and back side of the package substrate 2.

A vent hole 6 is formed in the package substrate 2 through both main surface and back side. The vent hole 6 is formed so that voids and moisture contained in an adhesive 9 for fixing a chip 8 to the package substrate 2 can escape to the exterior before or during heat treatment in an assembling process (post-process) for the semiconductor device 1. Also as to the vent hole 6, a description will be given later.

Bump electrodes 7 are bonded to the conductor patterns 4 for wiring formed on the back side of the package substrate 2. The bump electrodes 7 are for mounting the semiconductor device 1 onto a mounting substrate and for connecting the semiconductor device 1 with wiring lines on the mounting substrate electrically. For example, the bump electrodes 7 are formed of lead (Pb)/tin (Sn) alloy and are, for example, 0.3 to 0.5 mm in diameter. As the material of the bump electrodes 7 there also may be used, for example, a tin (Sn)-silver (Ag)-base lead-free solder.

The overall thickness of the package substrate 2 (the sum of the thicknesses of substrate body 3, conductor pattern 4, and solder resist 5) is very small, for example, 0.2 mm or less, whereby the semiconductor device 1 can be designed thin. Thus, an electronic device or information processor with such a semiconductor device 1 mounted thereon can be designed in reduced size, thickness and weight.

The chip 8 is mounted centrally of the main surface of the package substrate 2 in such a manner that a main surface (elements-formed surface) faces up. The chip 8 is fixed to the main surface of the package substrate 2 using the adhesive 9 which is, for example, paste containing silver (Ag) or a silver-free insulating paste. On the main surface of the chip 8 is formed an integrated circuit such as, for example, a microprocessor, ASIC, or memory. The integrated circuit on the main surface of the chip 8 is electrically connected to bonding pads (external terminals) formed on a top wiring layer of the chip 8. The bonding pads are electrically connected through bonding wires 10 to conductor patterns 4 for wiring formed on the main surface of the package substrate 2. The bonding wires 10 are each formed by a fine gold (Au) wire of, for example, 25 $\mu$m in diameter. The bonding wires 10 are contacted and bonded with exposed areas from the solder resist 5 of the conductor patterns 4 for wiring formed on the main surface of the package substrate 2. However, the mounting form of the chip 8 is not limited to the connected form with the bonding wires 10, but there may be adopted, for example, a face-down bonding form in which the chip 8 is mounted onto the main surface of the package substrate 2 through bump electrodes formed on the main surface of the chip and is electrically connected with wiring lines formed on the package substrate 2.

The chip 8 and the bonding wire 10 are sealed with a seal member 11 which is coated onto the main surface of the package substrate 2. For example, the seal member 11 comprises an epoxy resin and a low molecular resin. The seal member 11 is formed so that its side faces are substantially perpendicular to the main surface of the package substrate 2. An overall height of the semiconductor device (the height from the mounting surface of the mounting substrate up to an upper surface of the semiconductor device) h1 is, for example, 1.2 to 1.4 mm.

Figure 4:
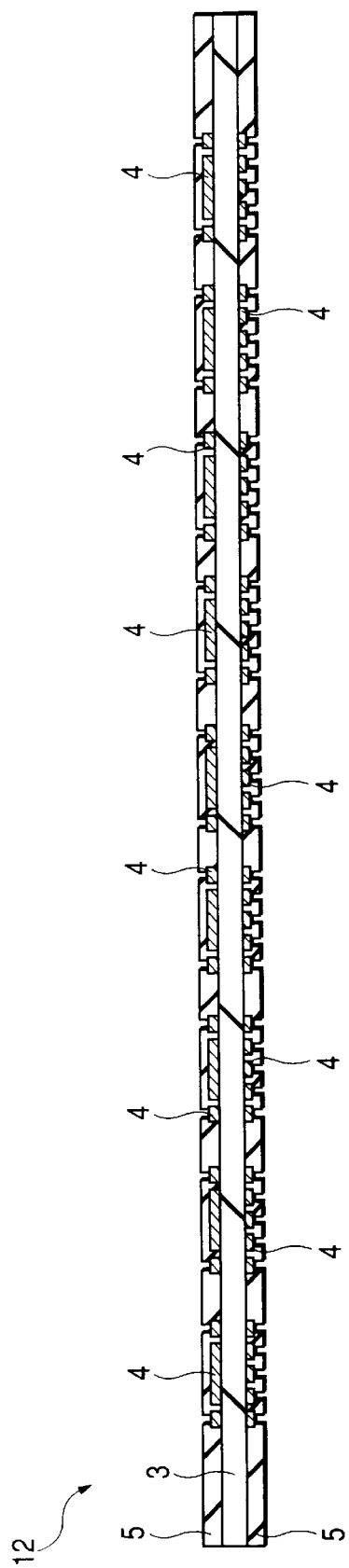
FIG. 4 is a sectional view taken on line A2—A2 in FIG. 3(a)

The following description is now provided about a strip substrate which is used in a manufacturing method for the semiconductor device of this embodiment. FIGS. 3 and 4 illustrate the strip substrate which is indicated at 12. FIG. 3(a) is a plan view of a main surface (chip mounting surface) of the strip substrate 12 and FIG. 3(b) is a plan view of a back side thereof (package mounting surface). FIG. 4 is a sectional view taken on line A2—A2 in FIG. 3. Although FIG. 3 is a plan view, hatching is used for plating wiring lines.

The strip substrate 12 is constituted by a thin plate which is generally rectangular in plan and which is, for example, 40 to 66 mm long by 151 mm wide and 0.2 mm or less in thickness. The strip substrate 12 is a matrix of the package substrate 2 and comprises the substrate body 3, conductor patterns 4, and solder resist 5. On each of the main surface and the back side of the strip substrate 12 are arranged, for example, a total of eighteen (2×9=18) semiconductor device forming areas DA, of which two lie in the transverse direction and nine lie in the longitudinal direction. The broken line in each semiconductor device forming area DA on the main surface of the strip substrate 12 represents a mounting area of the semiconductor chip 8. A boundary line between adjacent areas DA also serves as a cutting line which will be described later.

In four peripheral sides of each of the main surface and the back side of the strip substrate there are formed reinforcing patterns 13 (13a, 13b, 13c) so as to surround a group of semiconductor device forming areas DS (product areas). The reinforcing patterns 13 are for ensuring a required mechanical strength during conveyance of the strip substrate 12 and for suppressing warp and distortion induced by heat treatment during manufacture of the semiconductor device 1. With the reinforcing patterns 13, even if the strip substrate 12 is very thin, a required mechanical strength thereof can be ensured and hence the strip substrate 12 can be conveyed reliably. Besides, since it is possible to suppress warp and distortion caused by heat treatment in the manufacture of the semiconductor device 1, it is possible to ensure a high flatness of the semiconductor device. Consequently, a satisfactory sealing can be attained in a sealing step to be described later and it is possible to improve the yield of the semiconductor device 1.

From only the standpoint of ensuring the required mechanical strength of the strip substrate 12 it is preferable that the reinforcing patterns 13 be formed continuously along outer peripheral sides of the strip substrate. But in the illustrated example the reinforcing patterns 13 (exclusive of the reinforcing pattern 13b) arranged dividedly for each of the semiconductor device forming areas DA on both main surface and back side of the strip substrate 12. This is for the following reason. In heat treatment during manufacture of the semiconductor device 1 there occur warp and twist of the strip substrate 12 due to, for example, a difference in thermal expansion coefficient of the material of the strip substrate (substrate body 3, conductor pattern 4, and solder resist 5), but a thermal stress induced is exerted relatively strongly between adjacent semiconductor device forming areas DA, so such a thermal stress should be dispersed and released by the above divided arrangement of the reinforcing patterns 13 to ensure an entire flatness of the strip substrate 12. Moreover, if the reinforcing patterns 13 are not dividedly arranged, there may occur a residual image strain in the portion of the reinforcing pattern 13 between adjacent semiconductor device forming area DA, which strain should be avoided by the divided arrangement of the reinforcing patterns 13. Moreover, by providing the reinforcing patterns 13 dividedly for each of the semiconductor device forming areas DA, it is possible to not only ensure an entire flatness of the strip substrate 12 but also ensure flatness for each semiconductor device forming area DA which substantially becomes a semiconductor device, thus making it possible to effect resin sealing to a satisfactory extent and improve the yield of the semiconductor device 1. Further, since any reinforcing pattern 13a is not present on cutting lines of the strip substrate 12, it is possible to prevent the occurrence of any conductor foreign matter (burr) of reinforcing patterns 13a when the strip substrate 12 is cut and hence possible to prevent the occurrence of a short-circuit fault or the like caused by presence of such a foreign matter.

Figure 5:
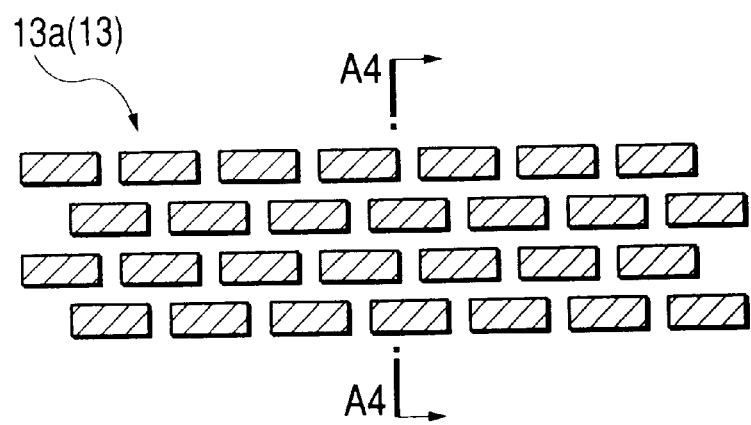
FIG. 5 is an enlarged plan view showing a principal portion of a reinforcing pattern formed on the strip substrate in FIG. 3.
Figure 6:
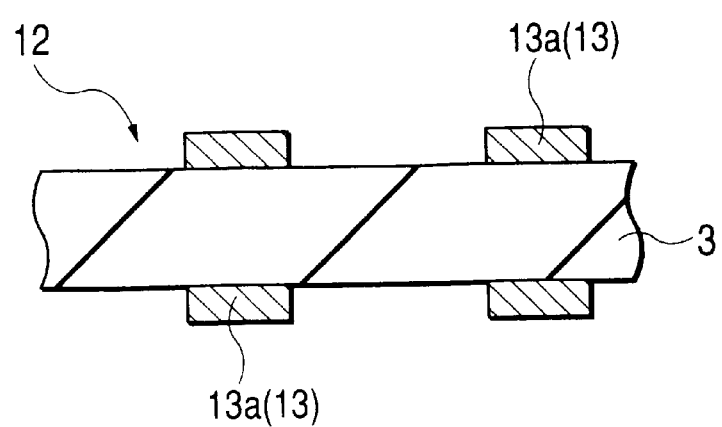
FIG. 6 is a sectional view taken on line A4—A4 in FIG. 5.

The reinforcing patterns 13 are formed by copper foil for example in the same pattern forming step as the conductor patterns 4. Of the reinforcing patterns 13, the reinforcing patterns 13a are formed not as solid patterns but as tile-like patterns for example. FIG. 5 is an enlarged plan view of each reinforcing pattern 13a and FIG. 6 is a sectional view taken on line A4—A4 thereof. The reinforcing pattern 13a is constituted by plural rectangular fine patterns (first patterns) separated from one another and arranged regularly in both longitudinal and transverse directions of the reinforcing patterns 13a. But in this reinforcing pattern 13a, rectangular fine patterns adjacent to each other in the transverse direction of the pattern 13a are displaced from each other in the longitudinal direction of the pattern 13a.

The reason why the reinforcing pattern 13a is formed tile-like is that the reinforcing pattern 13a is to be capable of expanding and contracting during the above heat treatment to mitigate heat shrinkage caused by the foregoing heat stress. As a result, the heat stress induced during the heat treatment in the manufacturing process for the semiconductor device 1 can be relaxed and the occurrence of a residual image strain can be suppressed or prevented, whereby the flatness of the strip substrate 12 can be further improved.

Figure 7A:
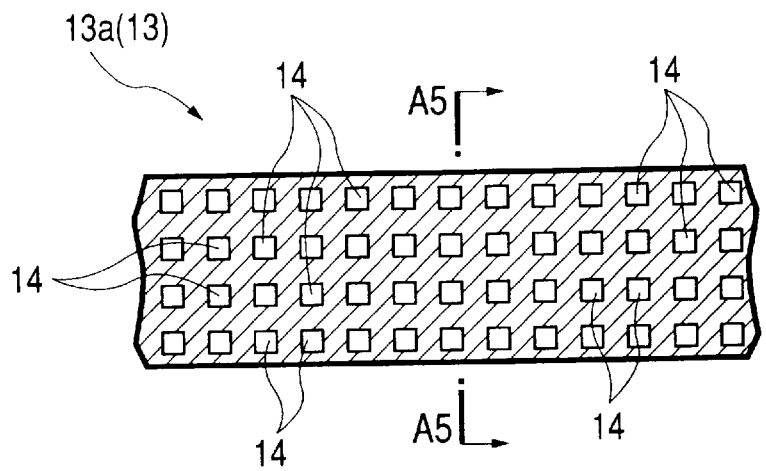
FIG. 7(a) is an enlarged sectional view of a principal portion showing another example, as a modified example, of a reinforcing pattern formed on the strip substrate illustrated in FIG. 3
Figure 7B:
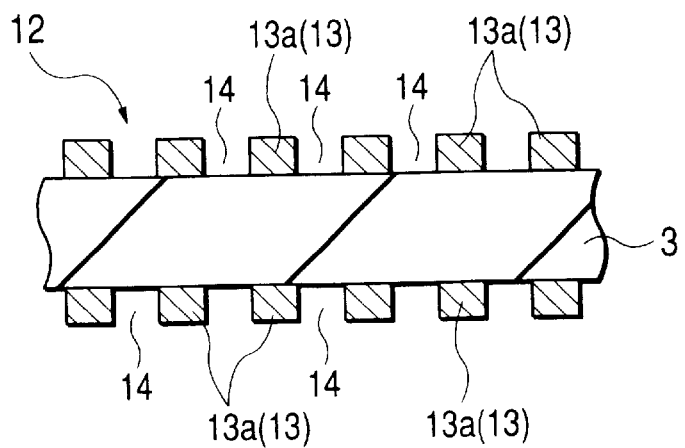
FIG. 7(b) is a sectional view taken on line A5—A5 in FIG. 7(a)

However, the shape of the reinforcing pattern 13a is not limited to the tile shape. Various changes may be made if only the shape adopted is basically capable of expansion and contraction and capable of absorbing the thermal stress. For example, there may be adopted such a structure as shown in FIG. 7. FIG. 7(a) is an enlarged plan view of a principal portion of the reinforcing pattern 13a and FIG. 7(b) is a sectional view taken on line A5—A5 of FIG. 7(a). Although FIG. 7(a) is a plan view, hatching is used for the conductor pattern to make the drawing easier to see.

The reinforcing pattern shown in FIG. 7 is a dot-like pattern. In this reinforcing pattern 13a, a plurality of rectangular conductor film-removed areas 14 are formed by removing part of the conductor film, provided the areas 14 are aligned with one another also in the transverse direction of the reinforcing pattern 13a.

Both reinforcing patterns 13a shown in FIGS. 5 and 7 can afford the effect related to the foregoing thermal stress, but the pattern shown in FIG. 5 is preferred from the standpoint of ensuring a high mechanical strength of the strip substrate 12. This is because in the structure of the reinforcing pattern 13a shown in FIG. 5 the patterns (conductor film-removed areas 14, rectangular fine patterns) adjacent in the transverse direction of the reinforcing pattern are displaced from one another in the longitudinal direction of the reinforcing pattern. Besides, the use of the reinforcing pattern 13a shown in FIG. 5 is effective in avoiding the occurrence of a residual image strain in comparison with the other structure. This is because in the case of the reinforcing pattern 13a having the tile-like pattern structure shown in FIG. 5 its constituent rectangular fine patterns are spaced apart from one another and therefore strain does not remain in the reinforcing pattern itself.

Figure 8A:
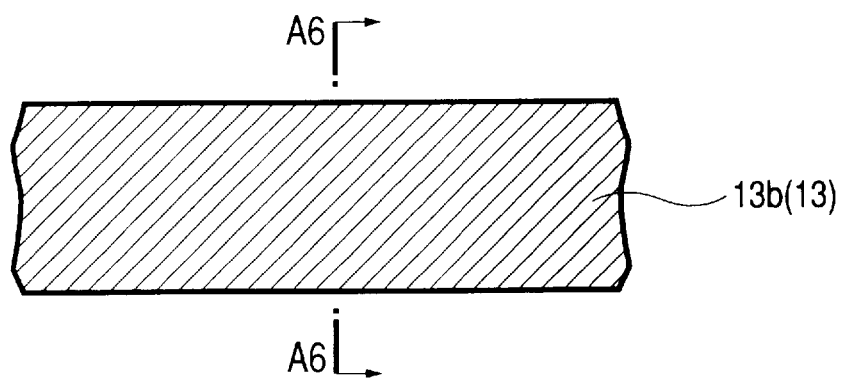
FIG. 8(a) is an enlarged plan view of a principal portion of a reinforcing pattern formed on the strip substrate shown in FIG. 3
Figure 8B:
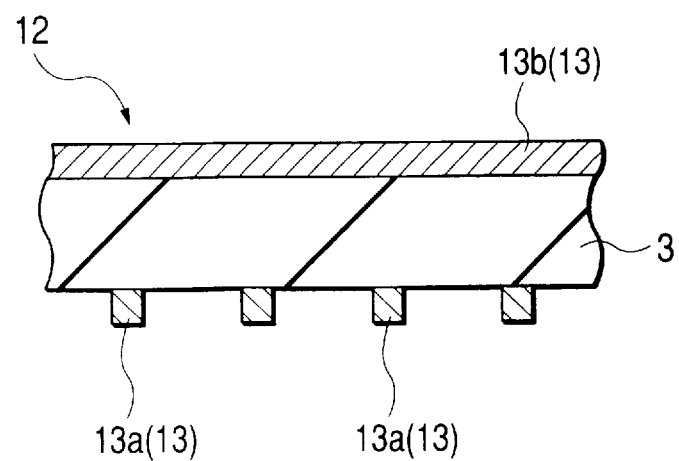
FIG. 8(b) is a sectional view taken on line A6—A6 in FIG. 8(a)

On the other hand, on the main surface (chip mounting surface) of the strip substrate 12 shown in FIGS. 3 and 4, the reinforcing pattern 13b arranged near one longitudinal side is not divided nor is it tile-like, but is a solid pattern. FIG. 8(a) is an enlarged plan view of a principal portion of the reinforcing pattern 13b and FIG. 8(b) is a sectional view taken on line A6—A6 of FIG. 8(a). Although FIG. 8(a) is a plan view, hatching is used for the conductor pattern to make the drawing easier to see.

The reason why the reinforcing pattern 13b is not divided but is formed as a solid pattern is that in a sealing step for the chip 8, etc. to be described later the arranged portion of the reinforcing pattern 13b may become a portion where a gate as a sealing mold is arranged. More particularly, a sealing resin is poured into a cavity of a sealing resin in direct contact with the reinforcing pattern 13b, so if the reinforcing pattern 13b is divided or formed mesh-like, it will become impossible to separate the strip substrate 12 from the sealing mold after the end of the sealing step. Such an inconvenience can be avoided by leaving the reinforcing pattern 13b undivided. In other words, the reinforcing pattern 13b may be divided if the sealing mold is of the type in which the gate thereof is divided.

The reinforcing pattern 13c is also formed as a solid pattern. This is because the reinforcing pattern 13c serves as a portion which affords rigidity during conveyance of the strip substrate 12. Conductor patterns 4m shown in FIG. 3 are for the supply of an electric current to the conductor patterns 4 arranged in the semiconductor device forming areas DA at the time of plating treatment.

Figure 9:
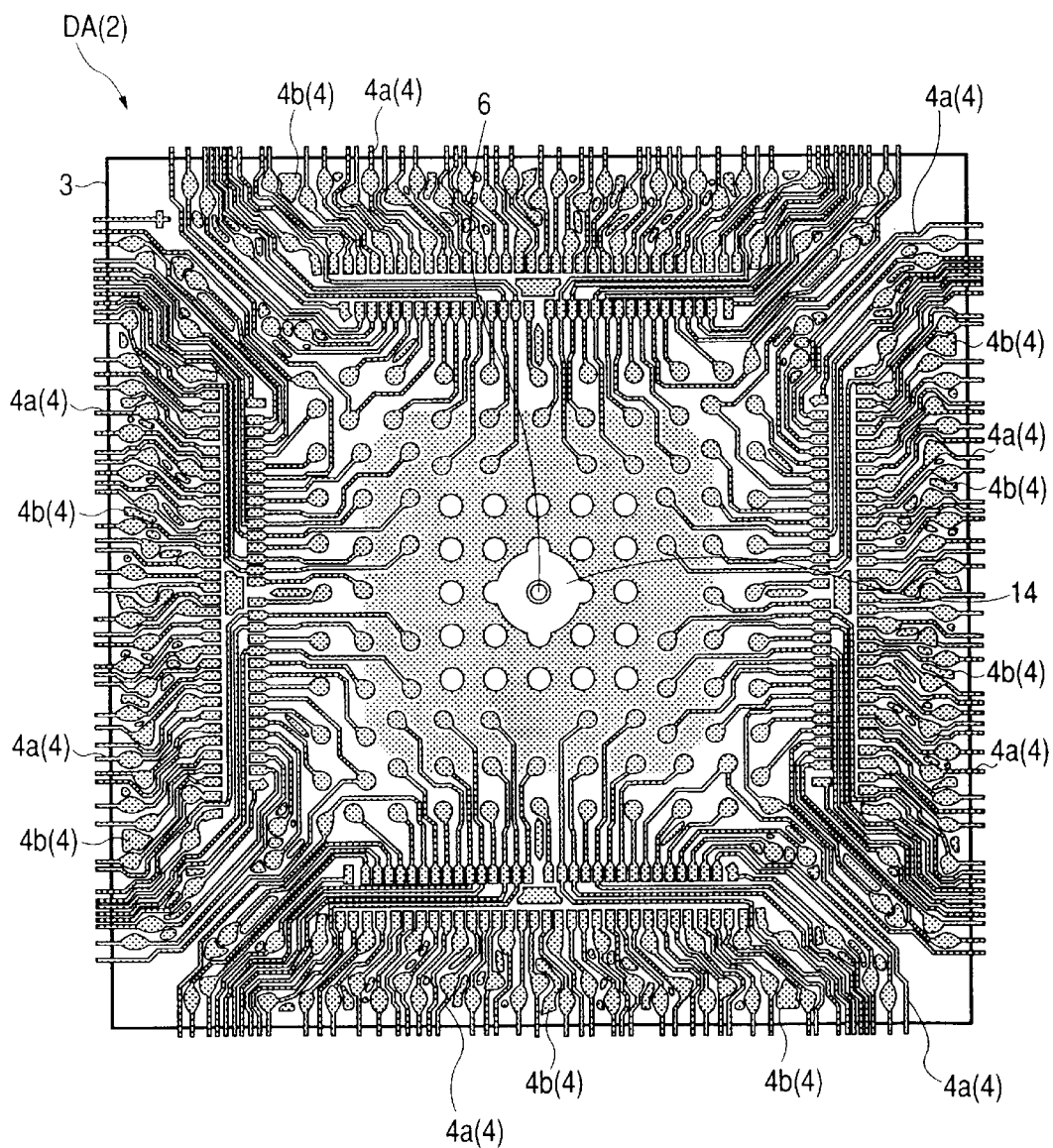
FIG. 9 is a plan view showing an example of conductor patterns formed in a semiconductor device forming area on the main surface of the strip substrate shown in FIG. 3.
Figure 10:
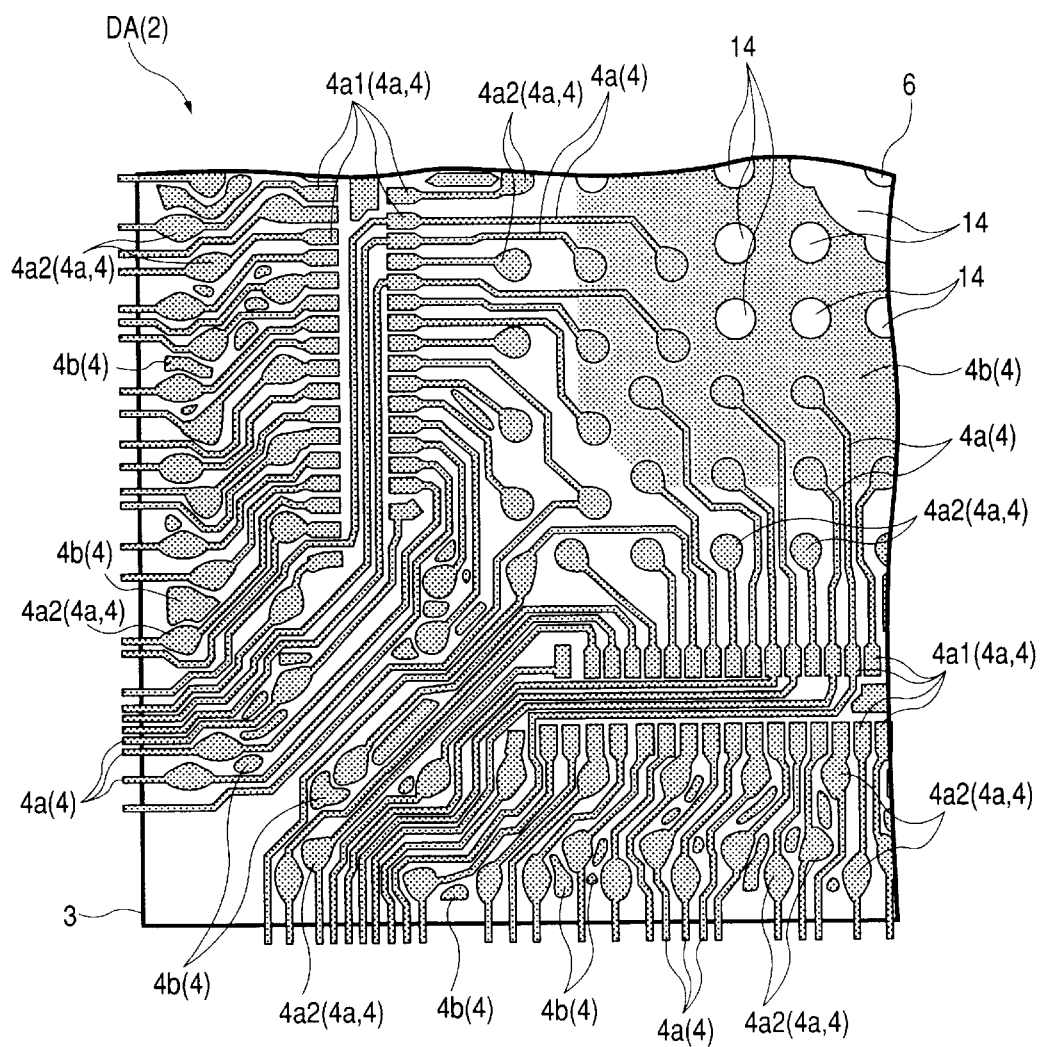
FIG. 10 is an enlarged plan view of a principal portion of FIG. 9.
Figure 11:
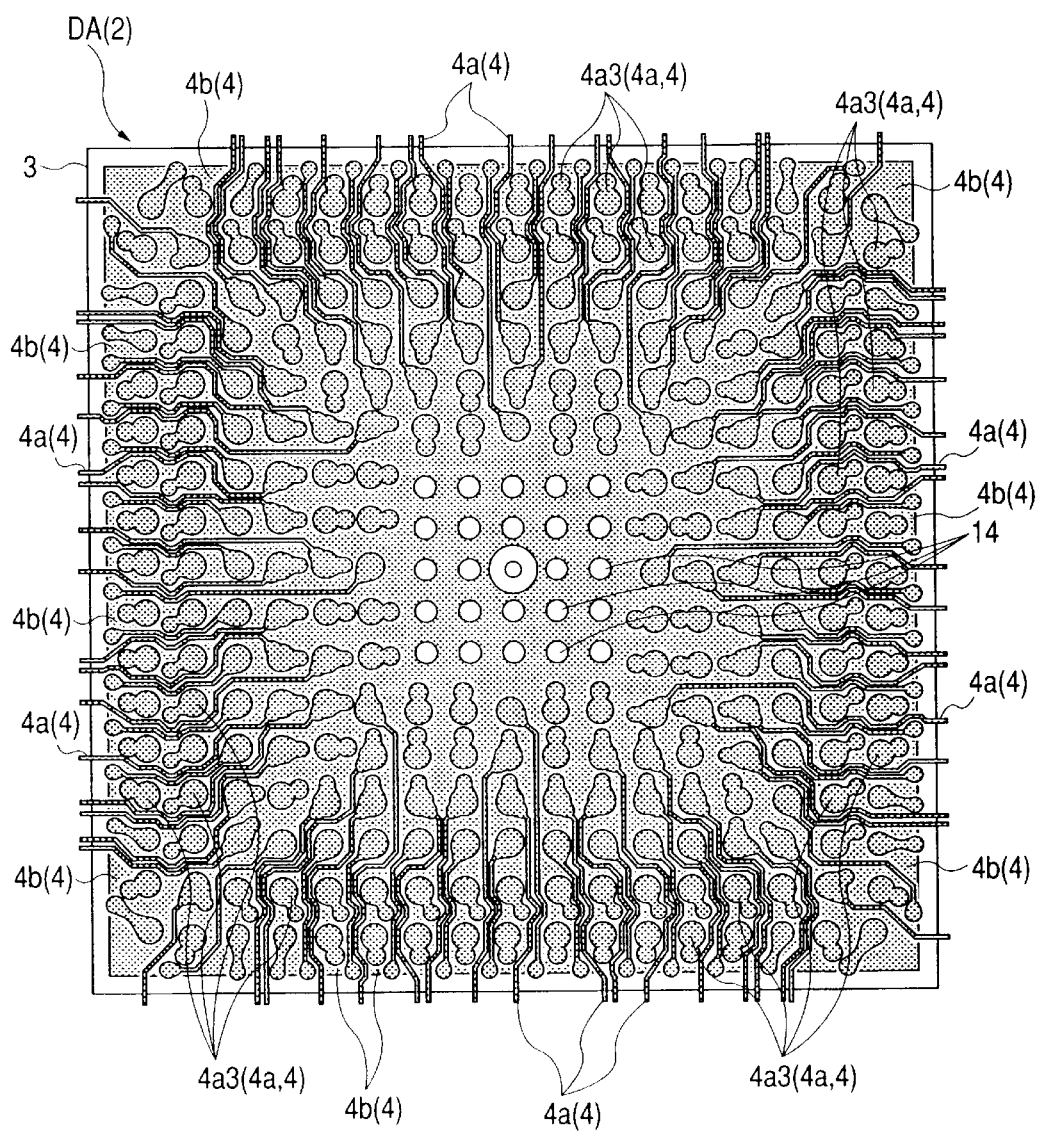
FIG. 11 is a plan view showing an example of conductor patterns formed in a semiconductor device forming area on the back side of the strip substrate shown in FIG. 3.
Figure 12:
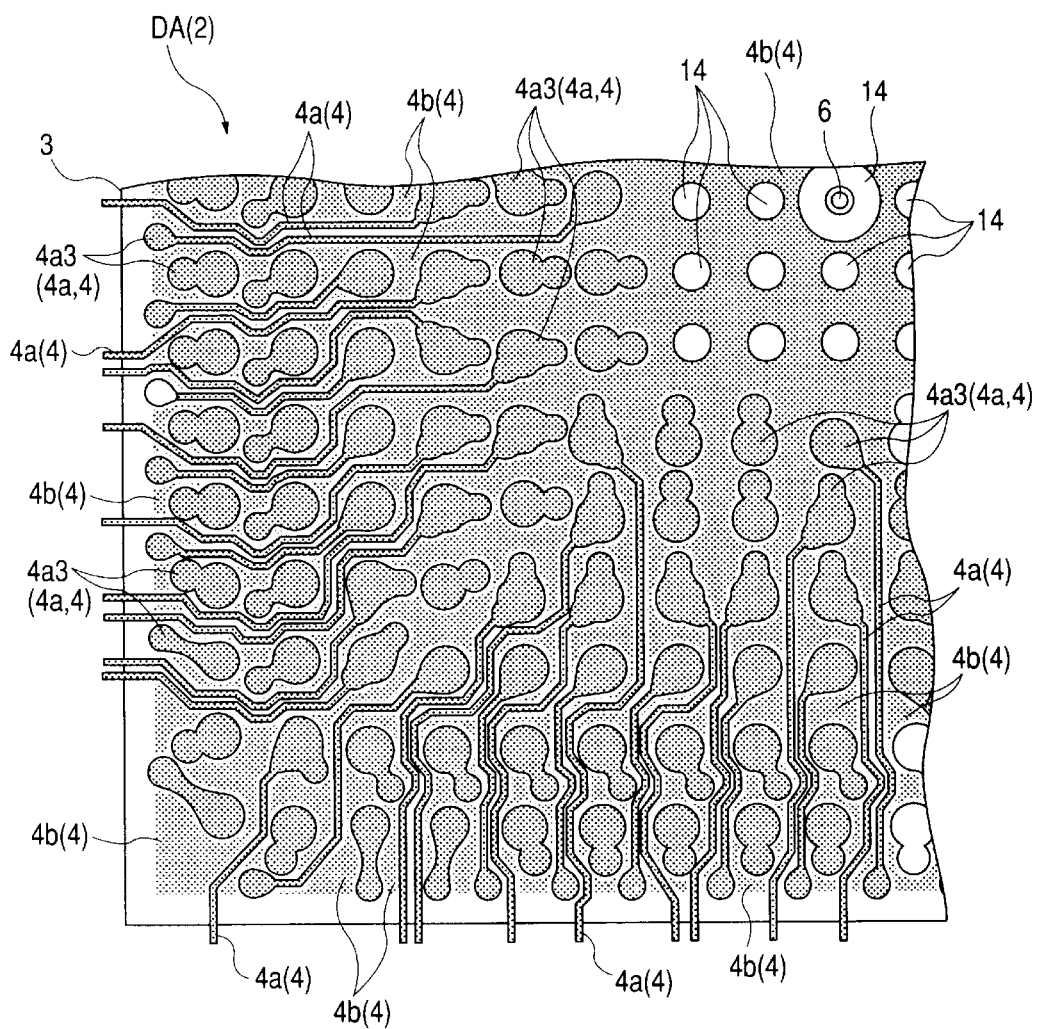
FIG. 12 is an enlarged plan view of a principal portion of FIG. 11.

A description will now be given about the arrangement of the conductor patterns 4 in the semiconductor device forming areas DA on both main surface and back side of the strip substrate 12. FIG. 9 is an entire plan view of a semiconductor device forming area DA on the main surface of the strip substrate 12 (i.e., the main surface of the package substrate 2 (chip mounting surface)), FIG. 10 is an enlarged plan view of a principal portion of FIG. 9, FIG. 11 is an entire plan view of a semiconductor device forming area DA on the back side of the strip substrate 12 (i.e., the back side of the package substrate 2 (package mounting surface), and FIG. 12 is an enlarged plan view of a principal portion of FIG. 11. In FIGS. 9 to 12, hatching is used for the conductor patterns 4 to make the arrangement of the conductor patterns 4 easier to see.

As noted earlier, in each of the semiconductor device forming areas DA on the main surface and back side of the strip substrate 12 (i.e., the main surface and back side of the package substrate 2) are formed conductor patterns 4b (4) for dummy in addition to the conductor patterns 4a (4) for wiring in order to enhance the density of the conductor patterns 4. By thus enhancing the density of the conductor patterns 4 in each semiconductor device forming area DA it is possible to diminish warp and undulation of the substrate within the semiconductor device forming area DA, i.e., within the package substrate 2, caused by heat treatment in the manufacturing process for the semiconductor device 1.

It is preferable that the state of arrangement (area, position, and density) of the conductor patterns 4 be almost the same on both main surface and back side of the strip substrate 12 (package substrate 2). By so doing, the amount of thermal shrinkage of the main surface and that of the back side can be made uniform and hence it is possible to diminish thermal warp and undulation of the substrate. Consequently, it becomes possible to improve the flatness of the strip substrate 12 and package substrate 2. Besides, by enhancing the density of conductor patterns 4, the solder resist 5 can be made difficult to be cracked, so that it becomes possible to prevent disconnection of the wiring conductor patterns 4a. Further, by interposing a conductor pattern 4b for dummy between adjacent wiring conductor patterns 4a it becomes possible to eliminate a stray capacitance between the adjacent wiring conductor patterns 4 and prevent the occurrence of induced noise.

However, if the density of conductor patterns 4 is enhanced too high, the area of contact between the substrate body 3 and the solder resist 5 becomes smaller, so that the bonding force between both components decreases. Therefore, as to the conductor patterns 4b for dummy, they are divided at appropriate positions. By so doing, it is possible to ensure a required area of contact between the substrate body 3 and the solder resist 5 and hence possible to improve the bonding force between the two. Moreover, at the time of reflow, a stress caused by a difference in thermal expansion coefficient between the chip 8 and the strip substrate 12 is apt to be concentrated around the mounted area of the chip and therefore peeling of the solder resist 5 is apt to occur. On this regard, either by minimizing the area of the conductor patterns for dummy or by failure to form them it is possible to diminish the disconnection of the conductor patterns 4 and peeling-off of the solder resist 5. As shown in FIGS. 9 to 12, in each semiconductor device forming area DA, i.e., centrally of the main surface and back side of the package substrate 2, is formed a large conductor pattern 4b for dummy which is generally square in plan. By thus forming a large conductor pattern 4b for dummy at a position to which the back side of the chip 8 (see FIG. 2) is opposed, it is possible to not only improve the density of the conductor patterns 4 referred to above but also improve the dissipation characteristic for the heat which is generated during operation of the chip 8. Besides, a plurality of circular conductor film-removed areas 14 are arranged regularly in the central conductor pattern 4b for dummy. With the conductor film-removed areas 4, it is possible to adjust the arrangement density of the conductor patterns 4 on the main surface and back side of the strip substrate 12 (i.e., the package substrate 2). Further, since it is possible to ensure a required area of contact between the substrate body 3 and the solder resist 5, the bonding strength between the two can be further improved.

Of the wiring conductor patterns 4a formed on the main surface of the strip substrate 12 (main surface of the package substrate 2) in FIG. 10, wide conductor patterns 4a1 (4), which are generally rectangular in plan, are pattern portions to which the bonding wires 10 are bonded. Likewise, of the wiring conductor patterns 4a, wide conductor patterns 4a2 (4), which are generally elliptic in plan, are pattern portions in which the through holes are located. Further, of the wiring conductor patterns 4a formed on the back side of the strip substrate 12 (back side of the package substrate 2) in FIG. 11, relatively wide conductor patterns 4a3 (4) are pattern portions in which the through holes are located and to which the bump electrodes 7 are bonded.

Figure 13:
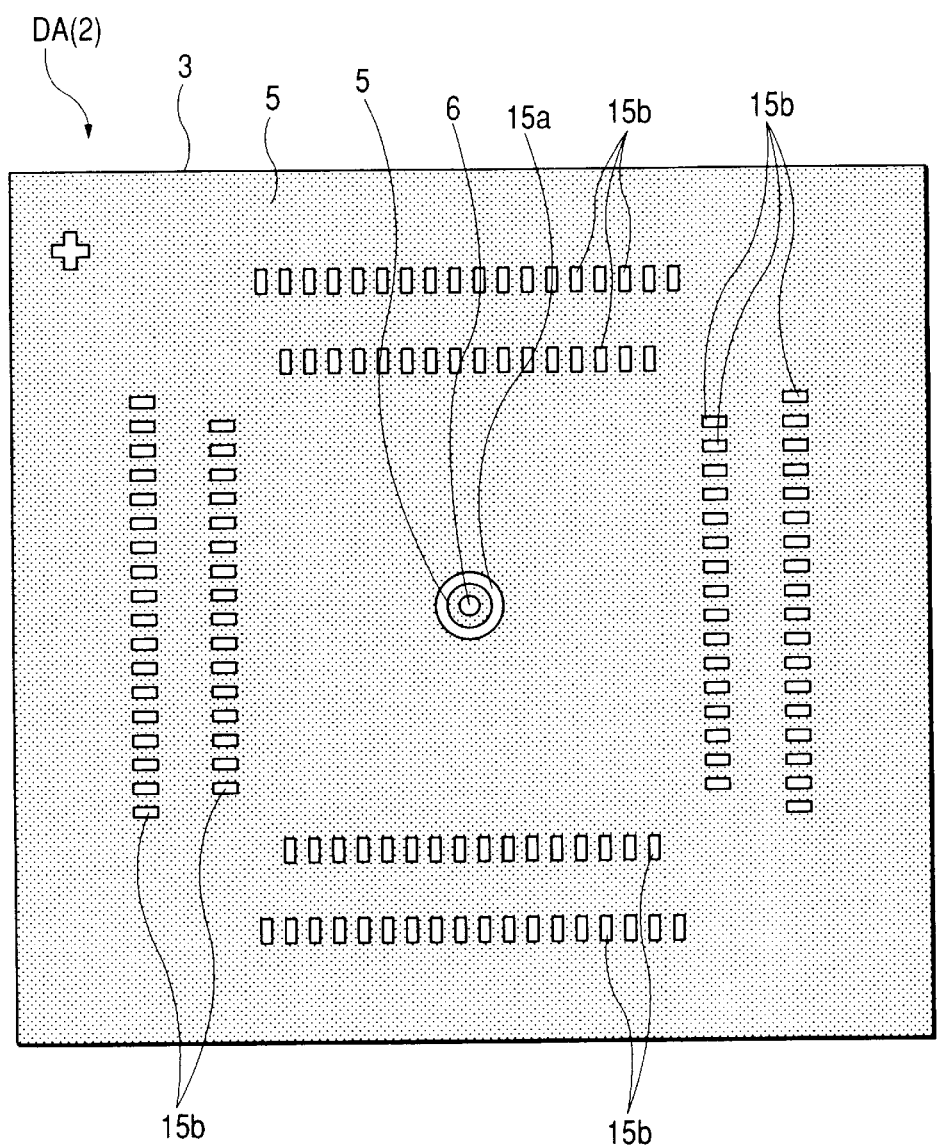
FIG. 13 is a plan view showing an example of an insulating film pattern formed in the semiconductor device forming area on the main surface of the strip substrate shown in FIG. 3.
Figure 14A:
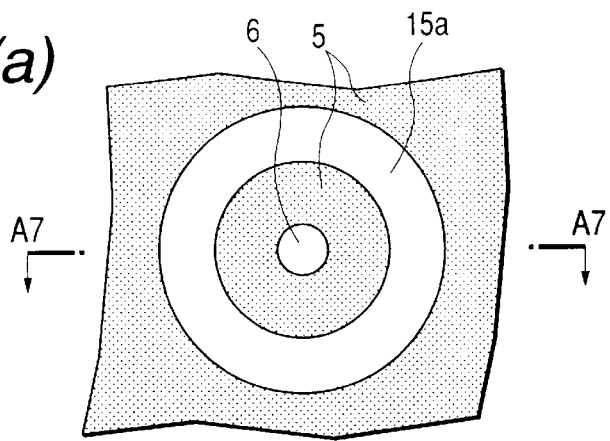
FIG. 14(a) is an enlarged plan view of a central portion of FIG. 13.
Figure 14B:
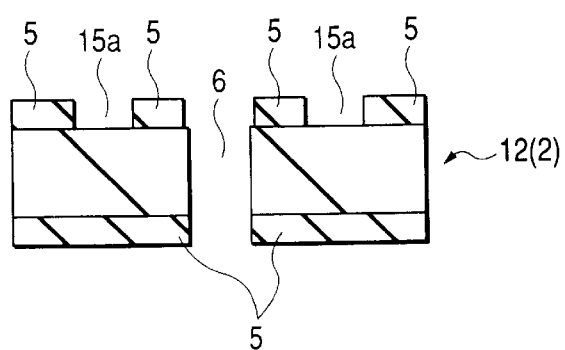
FIG. 14(b) is a sectional view taken on line A7—A7 in FIG. 14(a)
Figure 14C:
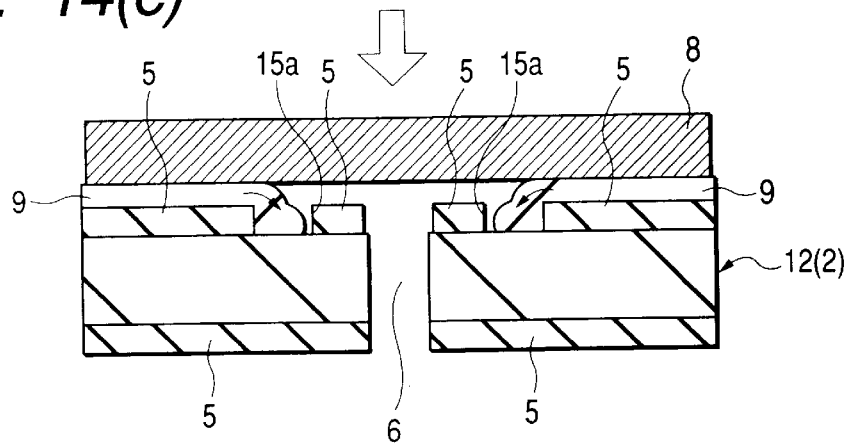
FIG. 14(c) is a diagram explanatory of operation based on the structure of FIG. 14(a)
Figure 15:
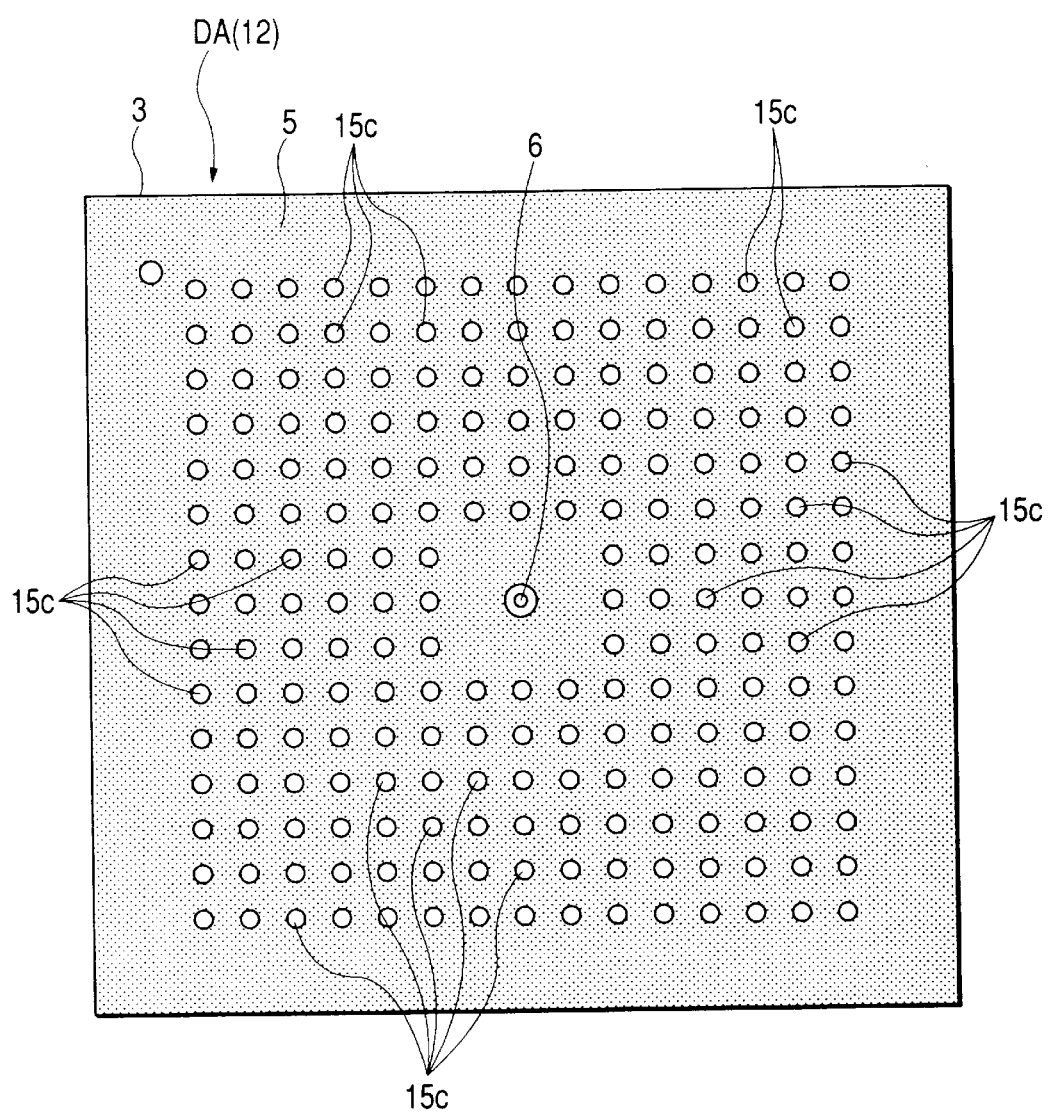
FIG. 15 is a plan view showing an example of an insulating film pattern formed in the semiconductor device forming area on the back side of the strip substrate shown in FIG. 3.

The following description is now provided about the arrangement of the solder resist 5 in each of the semiconductor device forming areas DA on the main surface and back side of the strip substrate 12. FIG. 13 is an entire plan view of each semiconductor device forming area DA on the main surface of the strip substrate 12 (i.e., main surface (chip mounting surface) of the package substrate 2)), FIG. 14(a) is an enlarged plan view of a central portion of FIG. 13, FIG. 14(b) is a sectional view taken on line A7—A7 of FIG. 14(a), FIG. 14(c) is a diagram explanatory of operation based on the structure of FIG. 14(a), and FIG. 15 is an entire plan view of each semiconductor device forming area DA on the back side of the strip substrate 12 (i.e., back side of the package substrate 2 (package mounting surface)). In FIGS. 13, 14(a), and 15, hatching is used to make the arrangement of the solder resist 5 easier to see.

As noted above, the solder resist 5 is formed nearly uniformly on each of the semiconductor device forming areas DA on the main surface and back side of the strip substrate 12 (i.e., main surface and back side of the package substrate 2). That is, the solder resist 5 is formed on both main surface and back side at substantially equal thickness and area. Particularly, the solder resist 5 is formed also in the area free from conductor pattern 4 in order to minimize the difference in thermal shrinkage between the main surface and the back side in such conductor pattern-free area. Consequently, it is possible to keep constant the amount of thermal shrinkage of the main surface and that of the back side in the strip substrate 12 (package substrate 2) and hence possible to diminish warp and undulation of the substrate in each semiconductor device forming area DA, i.e., in the package substrate 2, which are caused by heat treatment in the semiconductor device manufacturing process. As a result, it becomes possible to improve the flatness of both strip substrate 12 and package substrate 2.

In this embodiment, as shown in FIGS. 13 and 14, a portion of the solder resist 5 is present so as to surround the vent hole 6 and a circular frame-like resist-removed area 15a is formed so as to surround the said solder resist portion. The resist-removed area 15a functions as a dam for preventing clogging caused by the adhesive 9. If the resist-removed area 15a is not provided, then at the time of fixing the chip 8 onto the main surface of the package substrate 2 through the adhesive 9, the adhesive 9 flows along the main surface of the package substrate 2 under a pressing force exerted thereon from the chip 8 and stops up the vent hole 6. On the other hand, if the resist-removed area 15a is provided, as shown in FIG. 14(c), the adhesive 9 which has been forced to flow stays and is trapped within the resist-removed area 15a, whereby it is possible to prevent clogging of the vent hole 6.

In FIG. 13, the conductor patterns 4a1 for bonding wire connection are exposed from a plurality of rectangular resist-removed areas 15b. Likewise, in FIG. 15, the conductor patterns 4a3 for bump electrode connection are exposed from a plurality of circular resist-removed areas 15c.

A semiconductor device manufacturing method embodying the present invention will be described below with reference to FIGS. 16 to 29, of which FIGS. 16 to 20 and 23 to 29 are sectional views of a principal portion being processed in a semiconductor manufacturing process.

The semiconductor manufacturing method of this embodiment is an MAP (Mold Array Package) type manufacturing method wherein plural chips 8 mounted on the strip substrate 12 are sealed at a time.

First, as shown in FIG. 16, the strip substrate 12 is provided and thereafter, as shown in FIG. 17, the chips 8 are mounted in the chip mounting areas on the main surface of the strip substrate 12 with use of the adhesive 9 which is an insulating paste for example, as shown in FIG. 17. The size of each chip 8 is, for example, 5 mm long by 5 mm wide to 8 mm long by 8 mm wide and 0.28 mm or so in thickness.

Then, as shown in FIG. 18, the bonding pads of the chips 8 and the wiring conductor patterns 4a1 on the main surface of the strip substrate 12 are electrically connected together using bonding wires 10, e.g., gold wires. For this electrical connection there was used a known wire bonder using both ultrasonic oscillation and thermocompression bonding.

Figure 19:
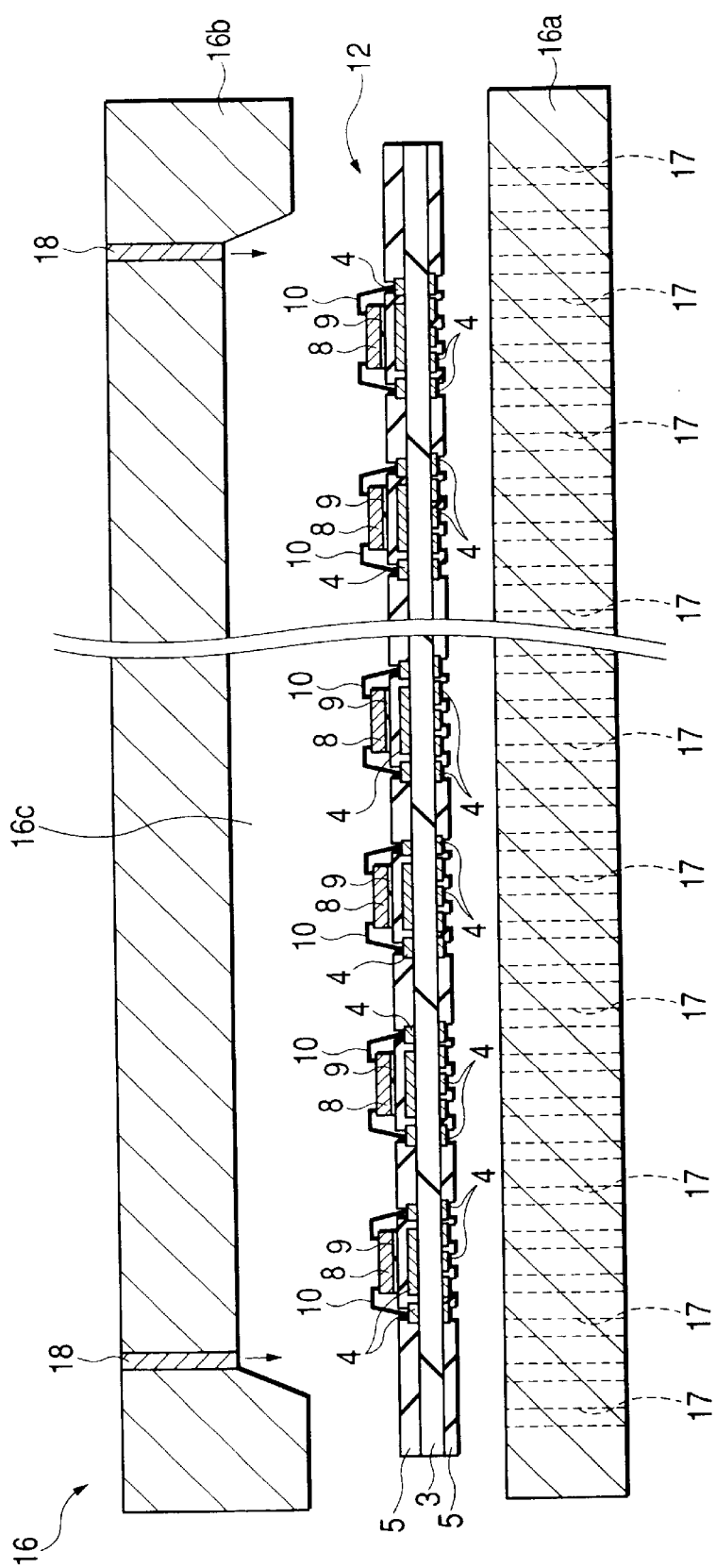
FIG. 19 is a sectional view of the strip substrate being processed in a step which follows FIG. 18.
Figure 20:
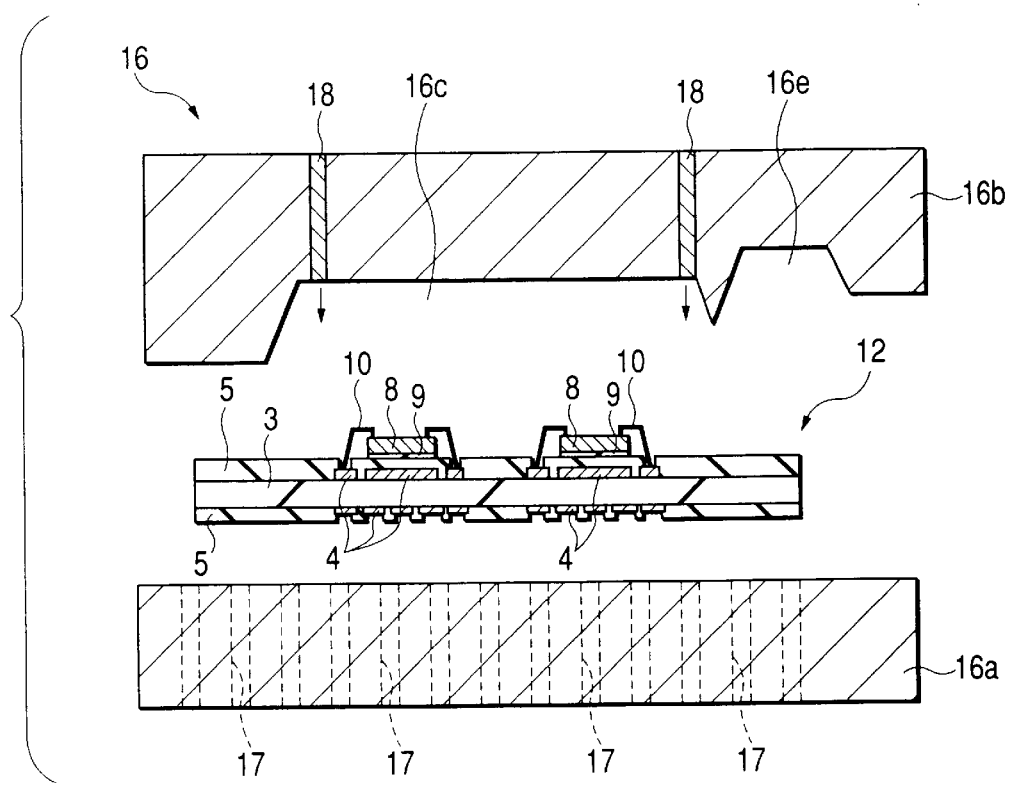
FIG. 20 is a sectional view of a plane perpendicular to FIG. 19.

Thereafter, as shown in FIGS. 19 and 20, the strip substrate 12 having gone through the above wire bonding step is conveyed to a mold 16. In this case, since the strip substrate 12 has a rigid structure as noted earlier, the conveyance can be done reliably without so caring for deformation and depression. FIG. 20 is a sectional view of a plane perpendicular to FIG. 19.

The mold 16 used in this embodiment is of an integral molding structure capable of resin-sealing the plural chips 8 on the main surface of the strip substrate 12 together at a time. In a lower mold half 16a of the sealing mold 16 are formed a plurality of vacuum suction holes 17. In a sealing step (from setting the strip substrate 12 into the mold 16 until sealing the plural chips 8 on the strip substrate with a sealing resin), the vacuum suction holes 17 chuck the back side (package mounting side) of the strip substrate 12 by suction and thereby firmly hold the strip substrate which is extremely thin. Particularly, the vacuum suction holes 17 function to suppress warp and distortion of the strip substrate 12 caused by heat of the lower mold half 16a.

In an upper mold half 16b are provided cavities 16c, cull blocks 16d, and gates 16e. The cavities 16c serve as resin pouring areas corresponding to molding portions. The cavities 16c used in this embodiment are large-sized cavities capable of sealing the plural chips 8 on the strip substrate 12 together at a time without dividing the chips. That is, plural chips 8 can be accommodated within one cavity 16c. The cull blocks 16d are resin portions remaining and solidified in hollows and depressions which are formed in the mold for the supply of a molding material into the cavities 16c, the molding material being injected with plungers to be described later. The gates 16e are inlets from which molten resin is poured into the cavities 16c of the mold 16. The upper mold half 16b is provided with ejector pins 18 so as to be projectable into the cavities 16c. The ejector pins 18 are for releasing the strip substrate 12 from the mold 16 after the end of the sealing step. The ejector pins 18 are arranged in the outer periphery of a group (product area) of the semiconductor device forming areas DA, that is, in the area cut off finally and not remaining in each semiconductor device 1. This is because traces and flaws in the seal member caused by the ejector pins 18 at the time of pushing the ejector pins against the seal member formed on the strip substrate 12 and taking out the strip substrate should not remain in the semiconductor device 1.

Figure 21:
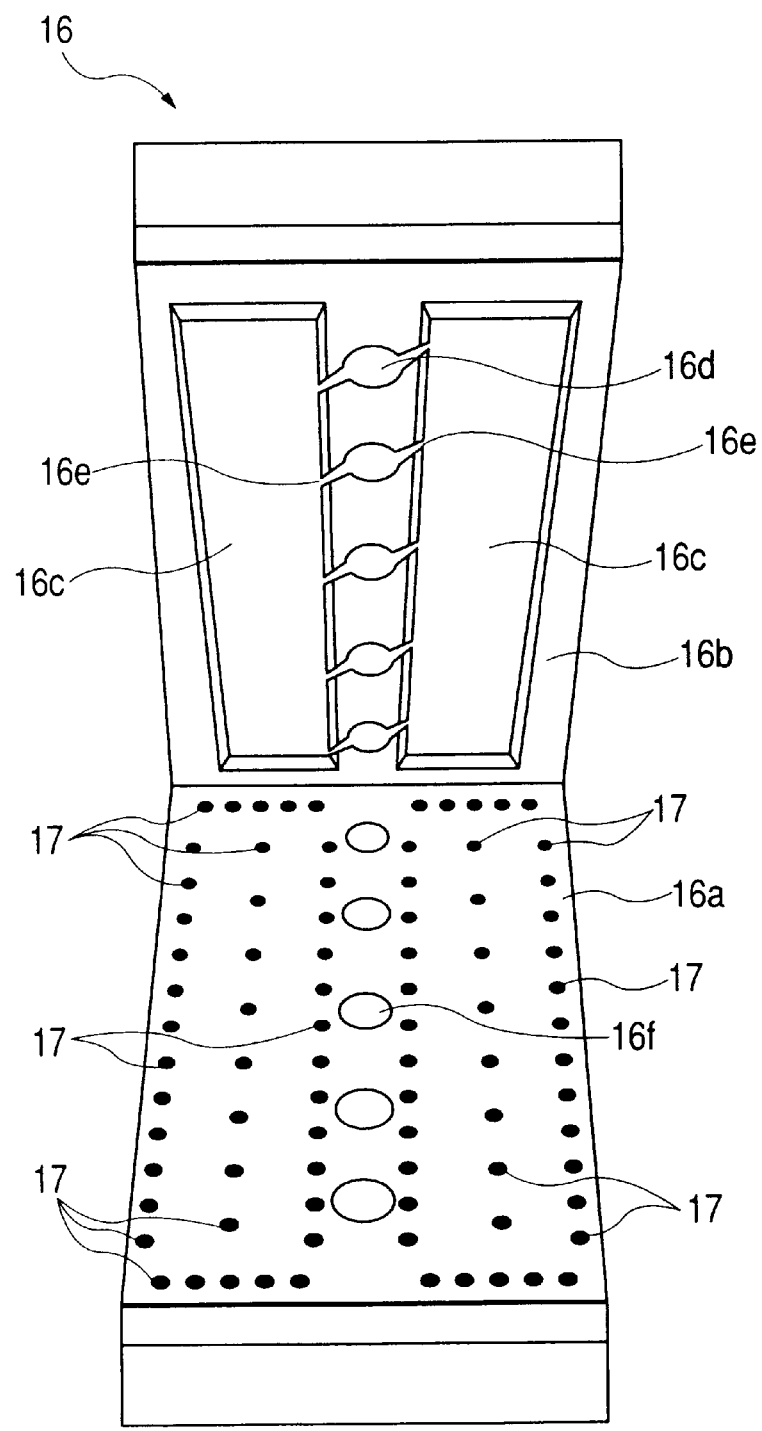
FIG. 21 is an explanatory diagram showing an example of a mold used in the semiconductor device manufacturing process embodying the present invention.
Figure 22:
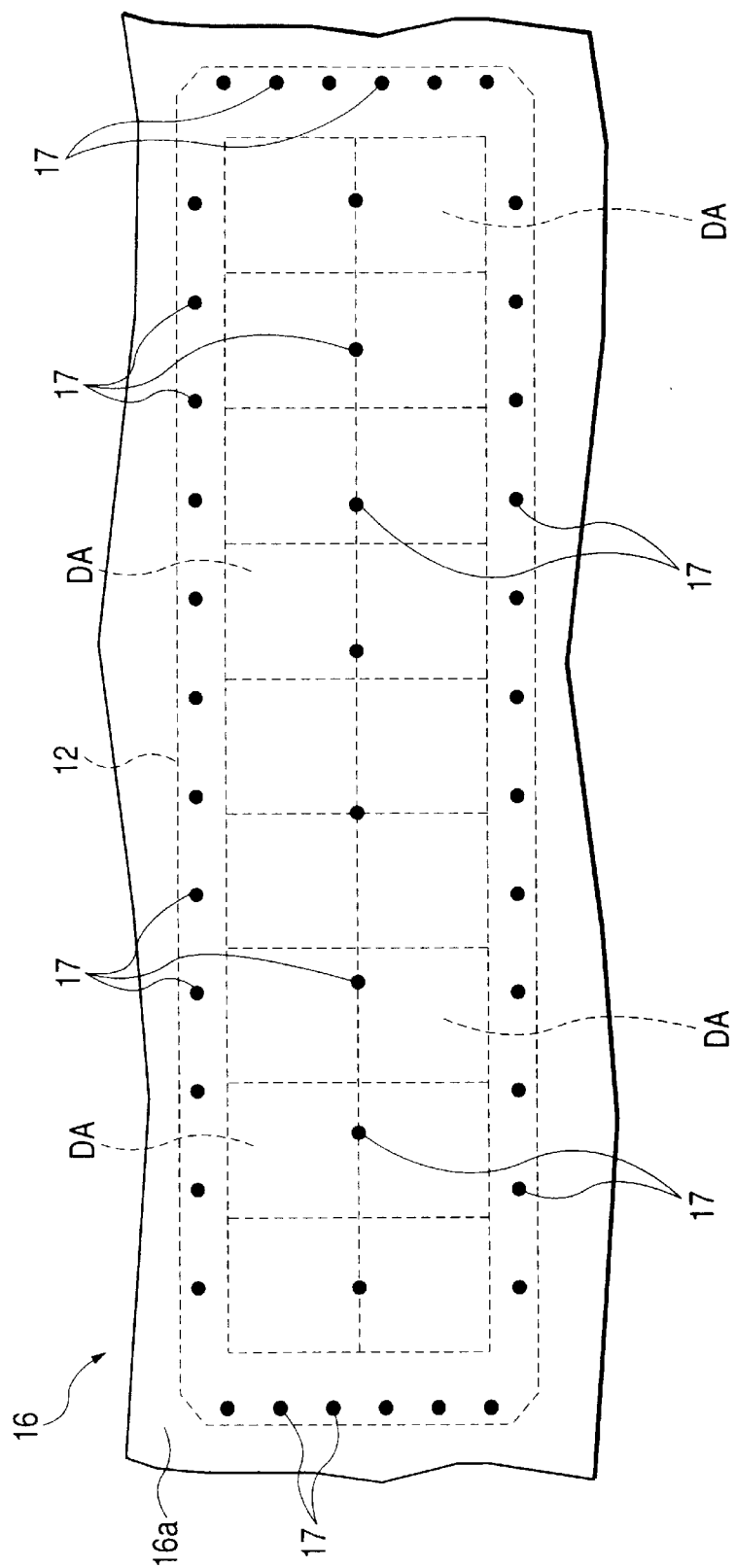
FIG. 22 is an enlarged plan view of a principal portion of a molding surface in a lower mold half of the mold shown in FIG. 21.

An example of the mold 16 is shown in FIGS. 21 and 22. FIG. 21 is an entire perspective view of the mold 16 and FIG. 22 illustrates a molding surface of the lower mold half 16a of the mold 16. FIG. 21 provides an illustration for making molding surfaces of the lower mold half 16a and upper mold half 16b easier to see, not illustrating open/close conditions of both molds.

With the illustrated mold 16, two strip substrates 12 can be sealed by a single sealing step. Centrally in the transverse direction of the molding surface of the lower mold half 16a are arranged a plurality of pot/plunger portions 16f in the longitudinal direction of the lower mold half. In the pot/plunger portions 16f, the pots are molding material feed ports, while the plungers are constructional portions for pouring the molding material present in the pots into the cavities and holding it under pressure. Strip substrates 12 are placed respectively on both sides of the column of the pot/plunger portions 16f.

In the arranged area of each strip substrate 12 on the molding surface of the lower mold 16a there are arranged the foregoing plural vacuum suction holes 17 regularly (indicated with black circles). It is preferable that the vacuum suction holes 17 be arranged within the plane of the strip substrate 12 and outside a group (product area) of the semiconductor device forming area). As will be described later, this is because in the resin sealing step small projections may be formed on the sealing resin due to vacuum suction for the back side of the strip substrate 12 and such small projections should be prevented from remaining on the semiconductor device 1. In this embodiment, however, the vacuum suction holes 17 are formed also in a position corresponding to the transversely central line of the strip substrate 12 because the planar size of the strip substrate is large and also because the strip substrate is required to be firmly vacuum-sucked to ensure its flatness. The area on the said central line corresponds to a cutting area to be described later and so will be cut off. Therefore, even if aforesaid projections remain on the central line just after the sealing step, they will not eventually remain on each semiconductor device 1, while even if they remain, it is possible to make them very small so as not to spoil the appearance. From the standpoint of achieving such an object the lower mold half 16a may be formed using a porous material so that the whole of the back side of the strip substrate 12 is vacuum-sucked substantially uniformly. In this case, the above problem associated with the projections does not occur because the whole of the substrate back side can be subjected to vacuum suction. That is, a lowering in yield of the semiconductor device 1 attributable to the above projections can be avoided.

On the other hand, centrally in the transverse direction of the molding surface of the upper mold half 16b are arranged a plurality of the cull blocks 16d in the longitudinal direction of the upper mold half. In the molding surface of the upper mold half 16b, moreover, the cavities 16c are arranged on both sides of the column of cull blocks 16d. Each cull block 16d and the cavities located on both sides thereof are in communication with each other through gates 16e.

Figure 23:
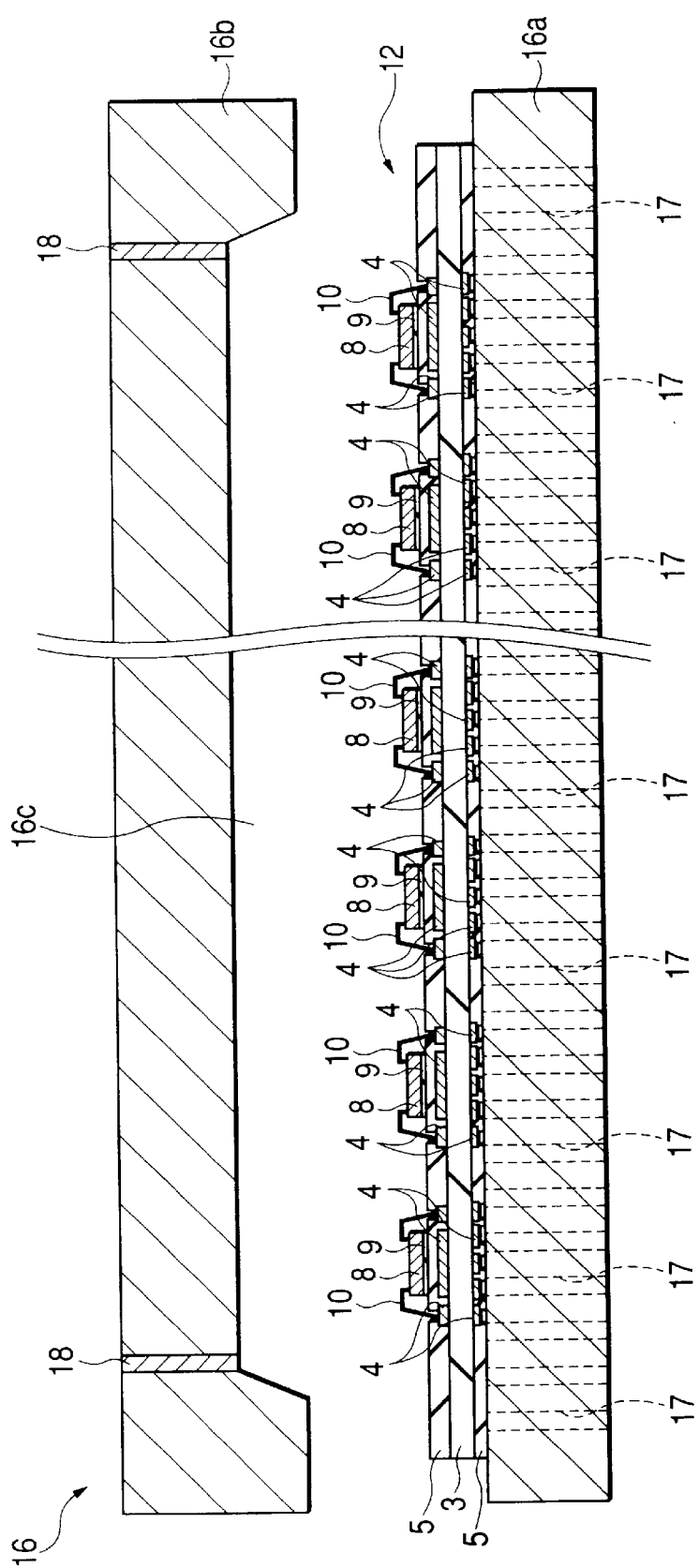
FIG. 23 is a sectional view of the strip substrate being processed in a step which follows FIG. 19.

Next, as shown in FIG. 23, the strip substrate 12 is placed on the molding surface of the lower mold half 16a and thereafter each strip substrate 12 is preheated for about 20 seconds while setting the temperature of the lower mold half 16a at 175° C. for example. This preheat treatment intends to make the strip substrate 12 steady against thermal deformation.

Thus, in this embodiment, the structure of the strip substrate 12 itself is difficult to undergo warp, undulation and distortion (simply as "warp, etc." hereinafter) induced by a thermal stress for example. Consequently, when the strip substrate 12 is placed on the mold 16, it is possible to diminish the warp, etc. of the strip substrate which is attributable to the mechanism of thermal conductivity. Further, as noted earlier, not only the entire flatness of the strip substrate 12 but also the flatness for each individual semiconductor device forming area DA can be ensured.

Figure 24:
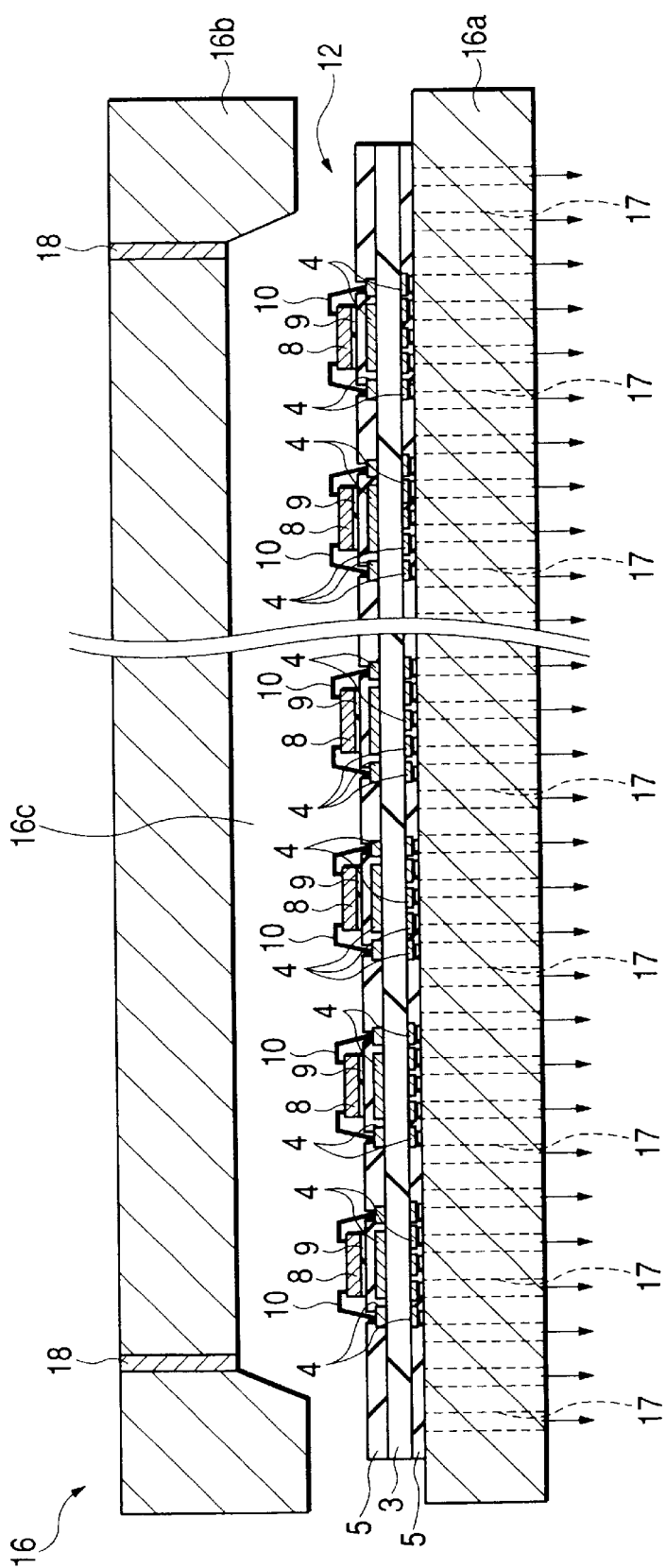
FIG. 24 is a sectional view of the strip substrate being processing in a step which follows FIG. 23.

Subsequently, as shown in FIG. 24, with the temperature of the lower and upper mold halves 16a, 16b set at 175° C. for example, the back side of the strip substrate 12 is chucked by the vacuum suction holes 17, causing the strip substrate 12 and the molding surface of the lower mold half 16a to come into close contact with each other. At this time, the strip substrate 12 can be vacuum-sucked to a satisfactory extent because the strip substrate is extremely thin as noted previously. Thus, in this embodiment, the back side of the strip substrate 12 is subjected to vacuum suction in the sealing treatment, whereby the warp, etc. caused by the foregoing heat treatment can be further diminished. Therefore, even if the plane area of the strip substrate 12 further increases to meet a demand for increase in the number of products to be obtained, or even if the thickness of the strip substrate 12 becomes still smaller to meet a demand for the reduction in wall thickness of the semiconductor device, it is possible to effect resin-sealing while ensuring flatness of the whole of the strip substrate 12 and of each semiconductor device forming area DA without causing the warp, etc. attributable to the foregoing heat treatment. The arrows affixed to the vacuum suction holes 17 in FIG. 24 et seq. indicate the direction of vacuum suction.

Figure 25:
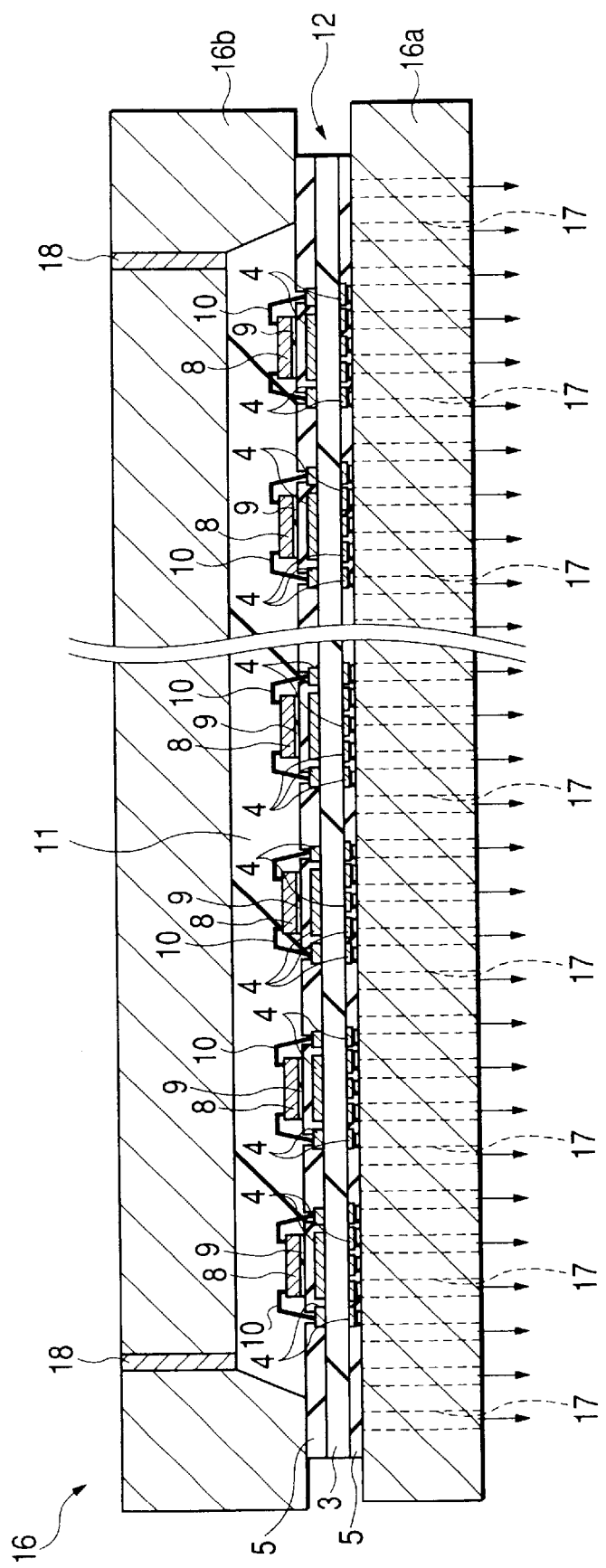
FIG. 25 is a sectional view of the strip substrate being processed in a step which follows FIG. 24.
Figure 26:
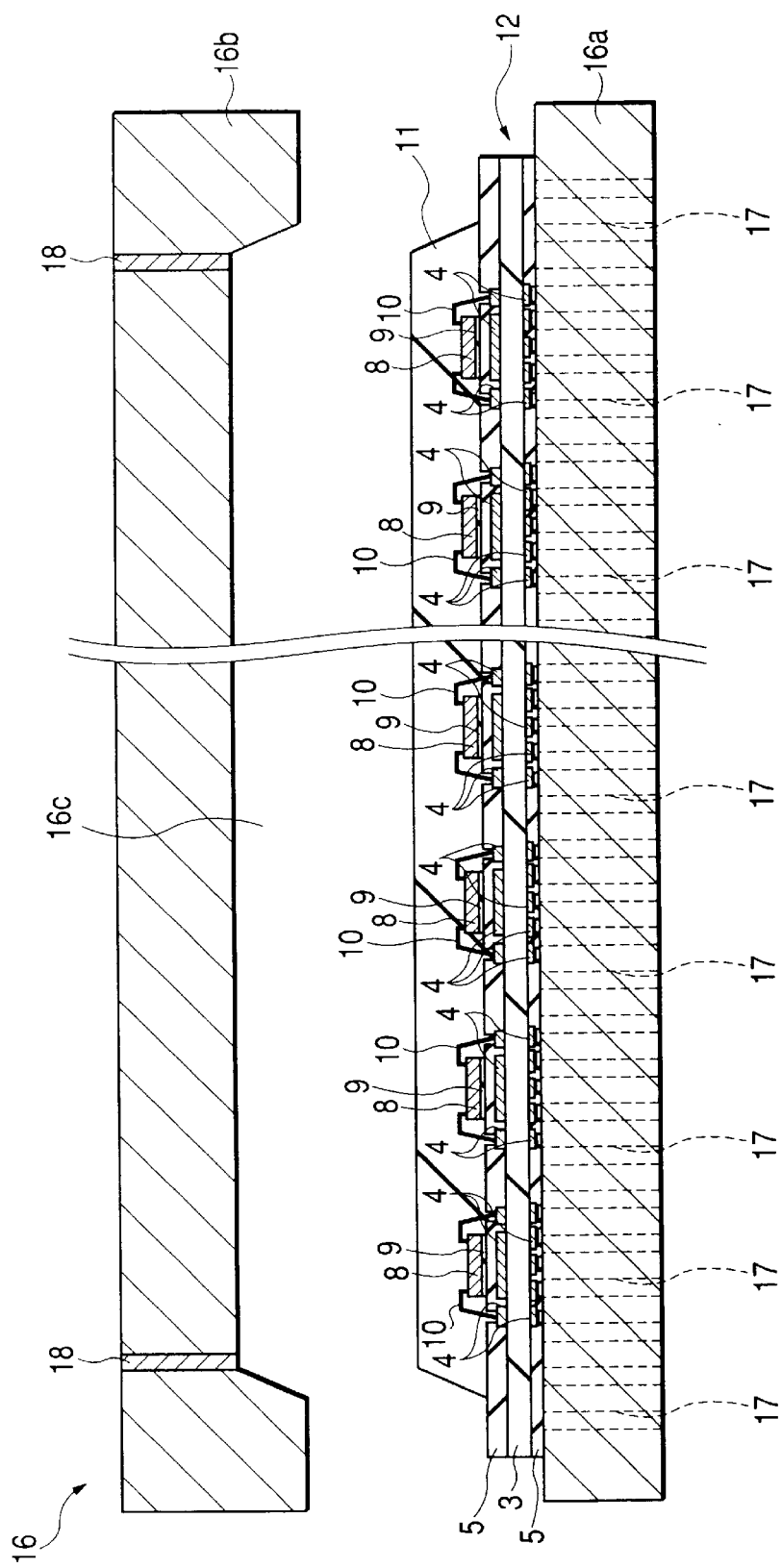
FIG. 26 is a sectional view of the strip substrate being processed in a step which follows FIG. 25.

Then, as shown in FIG. 25, a sealing resin, e.g., an epoxy resin and a low molecular resin, is poured into the cavities 16c of the upper mold half 16b while maintaining the above temperature and vacuum suction to seal the plural chips 8 and bonding wires 10 on the main surface of the strip substrate 12 together at a time, thereby forming a seal member 11 of an integral cubic shape containing plural chips 8 on the main surface side of the strip substrate 12. In this case, since the flatness of the strip substrate 12 in this embodiment is high, it is possible to effect a flat resin sealing. Consequently, the rate of occurrence of a defective appearance of the semiconductor device 1 can be decreased and therefore it is possible to improve the yield of the semiconductor device. Next, as shown in FIG. 26, while maintaining the temperature of the lower and upper mold halves 16a, 16b at the foregoing temperature, the ejector pins 18 provided in the upper mold half 16b are ejected toward the cavities 16c and each strip substrate 12 having the seal member 11 after the sealing step is taken out from the mold 16. The seal member 11 at this stage contains plural chips 8. The seal member 11 is charged into the space between adjacent semiconductor device forming areas without the presence of any void.

Figure 27:
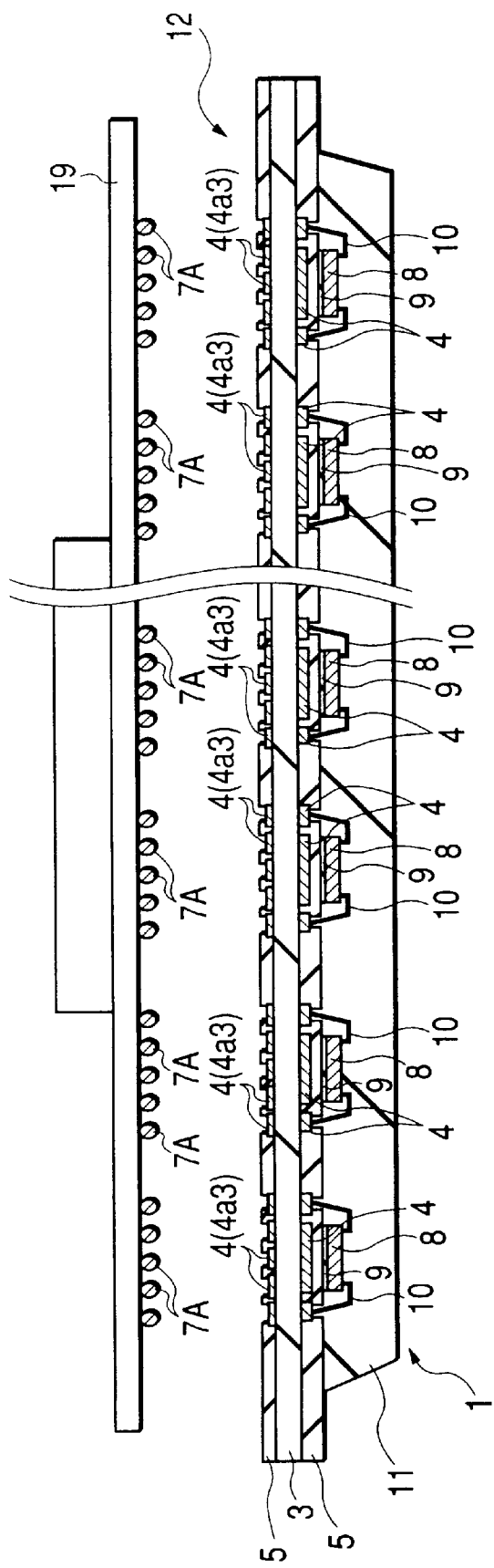
FIG. 27 is a sectional view of the strip substrate being processed in a step which follows FIG. 26.

Next, as shown in FIG. 27, solder bumps 7A are aligned and connected with the wiring conductor patterns 4 (4a3) in the semiconductor device forming areas DA formed on the back side of each strip substrate 12. The connection of the solder bumps 7A to the conductor patterns 4 is effected in the following manner. Plural solder bumps 7A, which are each formed in the shape of a hole beforehand, are held using a tool 19, then in this state the solder bumps 7A are dipped in a flux vessel to be surface-coated with flux, and thereafter the solder bumps 7A are temporarily fixed respectively to corresponding conductor patterns 4 (4a3) by utilizing the stickiness of the flux.

The solder bumps 7A are formed of lead/tin alloy and is, for example, 0.5 mm or so in diameter. The solder bumps 7A formed within one semiconductor device forming area DA may be connected together at a time, but from the standpoint of improving the throughput of the bump connecting step it is desirable that the solder bumps 7A in plural semiconductor device forming areas DA be connected together. In this case, the tool 19, which is of a large area, is used, so if the strip substrate 12 is warped or deformed, there may occur a problem that some solder bumps 7A are not bonded to conductor patterns 4. On the other hand, since in this embodiment the strip substrate 12 is little warped or deformed in the manufacturing steps so far carried out, plural solder bumps 7A in plural semiconductor device forming areas DA can be together connected to corresponding plural conductor patterns 4 (4a3) simultaneously with a high accuracy. Further, taking variations in the degree of warp or deformation into account, if there is used a device having a mechanism for forcibly clamping the whole of the strip substrate 12 to maintain the flatness of the substrate at the time of mounting the solder bumps, it is possible to further improve the connection accuracy.

Figure 28:
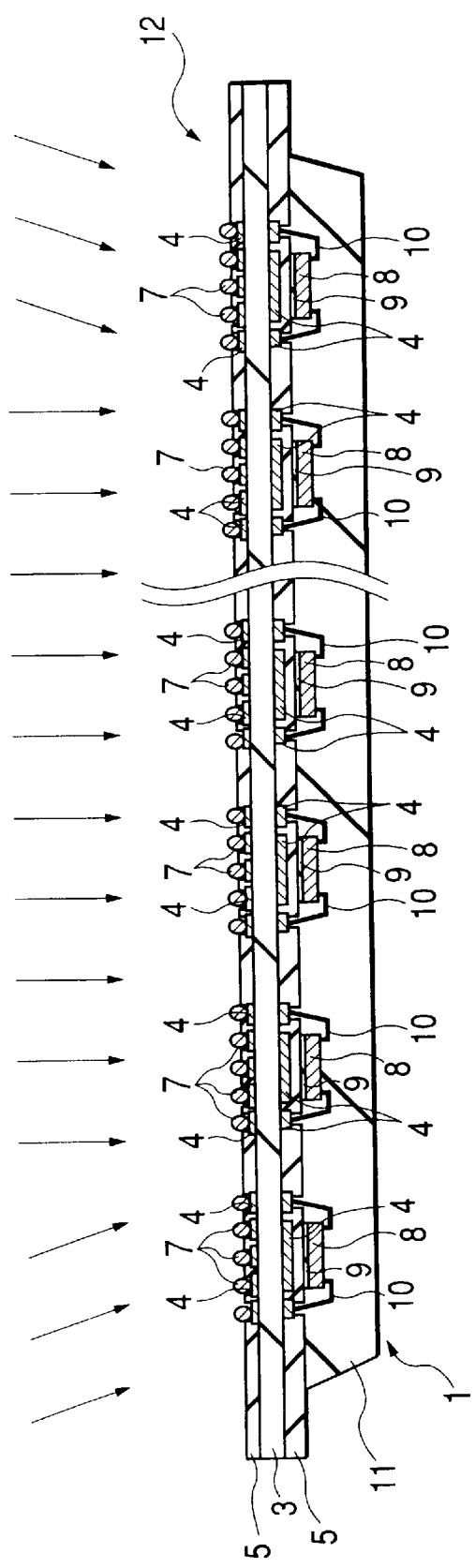
FIG. 28 is a sectional view of the strip substrate being processed in a step which follows FIG. 27.

Thereafter, the solder bumps 7A are fixed to the conductor patterns 4 (4a3) by heat-reflow at a temperature of about 235±5° C. to form bump electrodes 7, as shown in FIG. 28, and then the flux, etc. remaining on the surface of the strip substrate 12 is removed using a synthetic detergent or the like, whereby the bump connecting step is completed.

Figure 29:
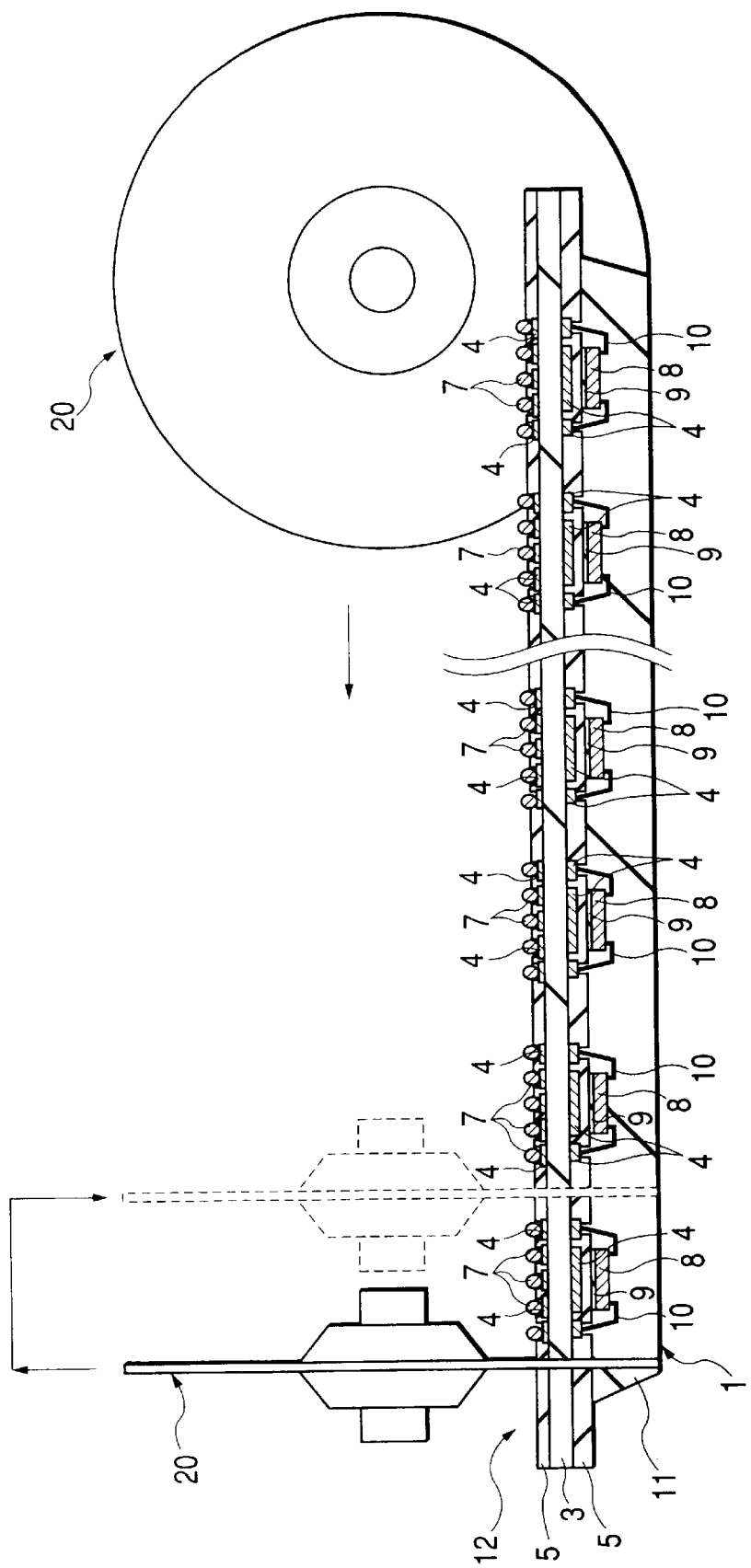
FIG. 29 is a sectional view of the strip substrate being processed in a step which follows FIG. 28.

Next, by cutting the strip substrate 12 there are obtained plural such semiconductor devices 1 as shown in FIGS. 1 and 2. For obtaining the semiconductor devices 1 from the strip substrate 12, as shown in FIG. 29, the strip substrate 12 is cut from its back side with use of a dicing blade 20 in the same way as in case of cutting a semiconductor wafer into chips 8.

Thus, in this embodiment, by increasing the number of products obtained per area of the strip substrate 12 on the premise that integral molding is performed, it becomes possible to decrease the unit price of the strip substrate 12. Also as to the mold 16, the initial cost can be reduced because it is not necessary to provide various shapes of molds. Further, since an integral multi-processing can cover plural steps, it is possible to reduce the manufacturing cost of the semiconductor device 1.

Figure 30:
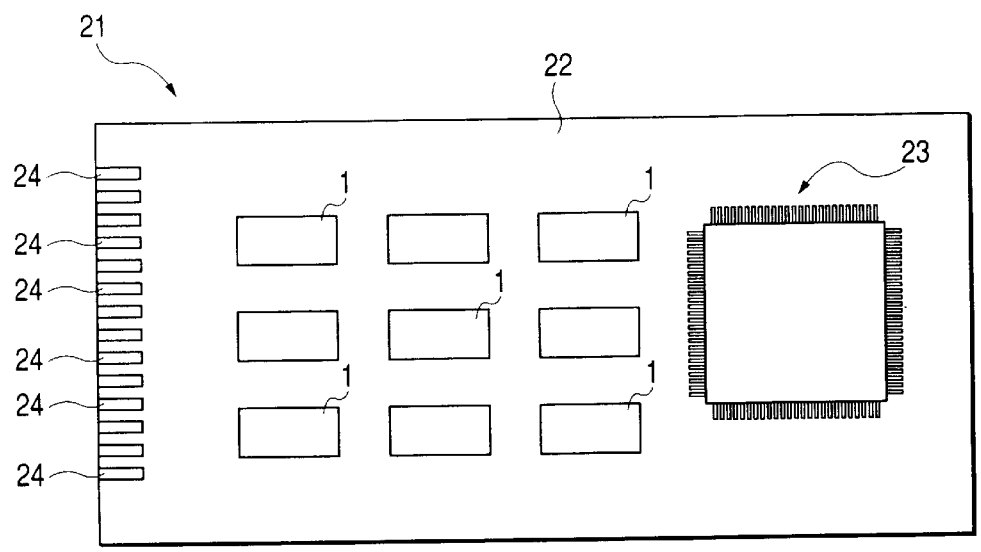
FIG. 30 is a plan view of a mounting substrate on which are mounted the semiconductor devices embodying the present invention.
Figure 31:
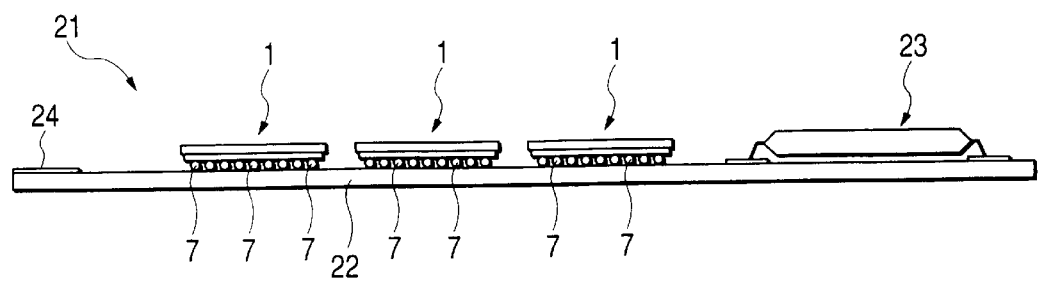
FIG. 31 is a side view of FIG. 30.

An example of an electronic device having the semiconductor devices 1 thus manufactured is shown in FIGS. 30 and 31. FIG. 30 is a plan view of a part of an electronic device 21 and FIG. 21 is a side view thereof.

The electronic device 21 is a memory card for example. But the application of the semiconductor device 1 of this embodiment is not limited to a memory card, but various other applications may be made. For example, the semiconductor device 1 may be used for constructing a logic circuit or may be mounted on an ordinary printed wiring board to constitute a predetermined circuit.

Like the package substrate 2 of the semiconductor device 1, a substrate body of a mounting substrate 22 as a constituent of the electronic device 21 is formed of glass-epoxy resin for example. On a main surface (package mounting surface) of the mounting substrate 22 are mounted a plurality of FBGA type semiconductor devices 1 through bump electrodes 7 in such a manner that their back sides (package mounting surfaces) face the main surface (package mounting surface) of the mounting substrate 22. Since the same material as that of the substrate body 3 of the package substrate 2 in the semiconductor device 1 is used as the material of the mounting substrate 22, it is possible to decrease a difference in thermal expansion coefficient between the semiconductor device 1 and the mounting substrate 22 and hence possible to diminish the occurrence of a thermal stress induced by the said difference. Consequently, it becomes possible to improve the mounting reliability of the plural semiconductor devices 1.

In the illustrated example, a memory circuit such as, for example, SRAM (Static Random Access Memory) or flash memory (EEPROM: Electric Erasable Programmable Read Only Memory) is formed in each semiconductor device 1. The memory circuit in each semiconductor device 1 is electrically connected with wiring lines on the mounting substrate 22 through bump electrodes 7 formed on the back side (package mounting surface) of the semiconductor device. In this way, as a whole, a memory circuit of a predetermined capacity is formed on the mounting substrate 22.

Further, a TQFP (Thin Quad Flat Package) type semiconductor device 23 is mounted on the main surface of the mounting substrate 22. The semiconductor device 23 is electrically connected with wiring lines on the mounting substrate 22 through gull wing-like leads projected from four sides of the package body thereof. The semiconductor devices 1 are incorporated in the memory circuit of a predetermined capacity formed on the mounting substrate 22 and function to control the operation of the memory circuit. On one end of the mounting substrate 22 are arranged plural external terminals 24 along the side of the one end. The external terminals 24 are electrically connected to wiring lines on the mounting substrate 22 and function to connect the memory circuit of a predetermined capacity formed on the mounting substrate 22 with an external device electrically. An overall height of each semiconductor device 1 and that of the semiconductor device 23 are almost equal to each other.

(Second Embodiment)

Figure 32:
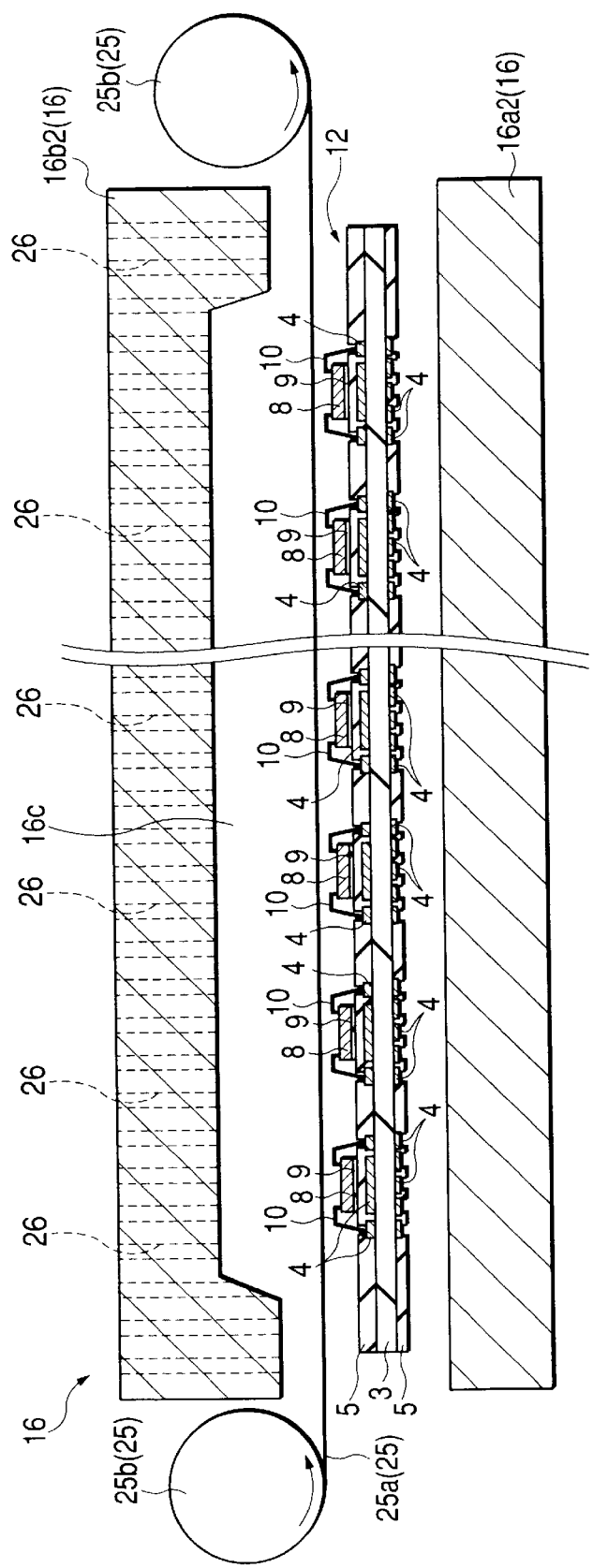
FIG. 32 is a sectional view of a strip substrate used in a semiconductor device manufacturing process further embodying the present invention invention.
Figure 33:
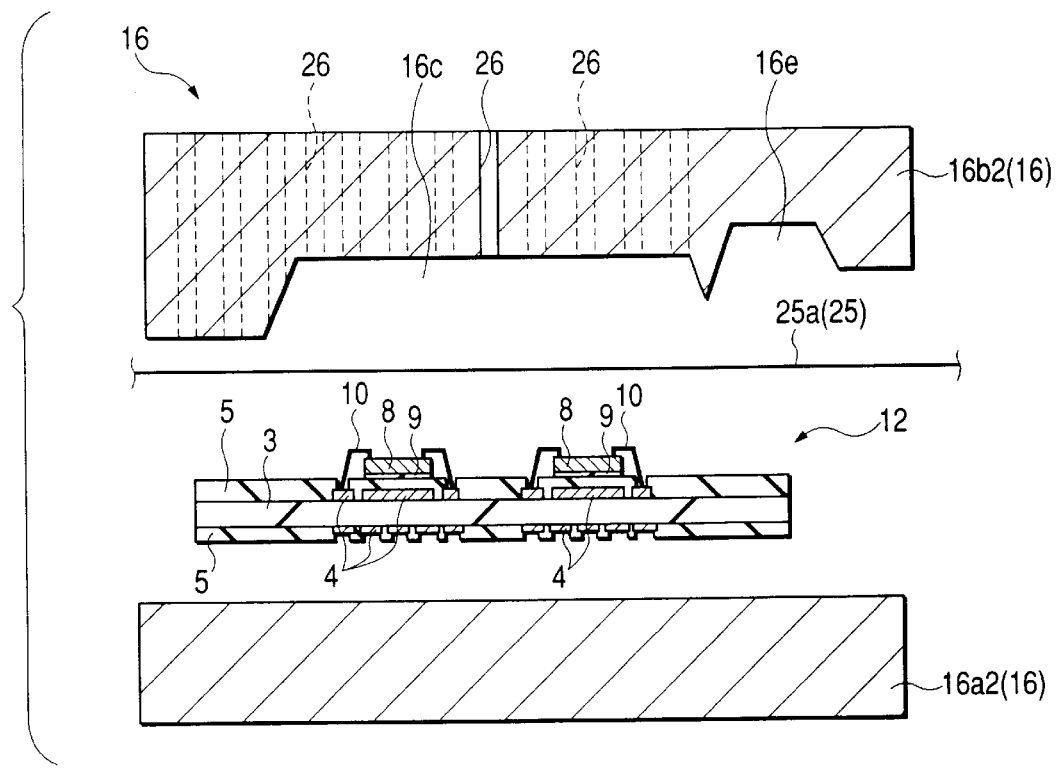
FIG. 33 is a sectional view of a plane perpendicular to FIG. 32.

In this second embodiment another example of a semiconductor device manufacturing method according to the present invention will be described. FIGS. 32 and 33 illustrate a state in which the strip substrate 12 has been conveyed to a mold 16, of which FIG. 33 is a sectional view of a plane perpendicular to FIG. 32.

In this embodiment, a laminate mechanism portion 25 is provided in a mold 16. The laminate mechanism portion 25 comprises a laminate film 25a and reels 25b for taking up the laminate film. The laminate film 25a is an insulating film of a high heat resistance having a size capable of covering approximately the whole of an inner wall surface of each cavity 16c of an upper mold 16b2. The laminate film 25a is interposed between a lower mold half 16a2 and the upper mold half 16b2 of the mold 16.

In this embodiment, vacuum suction holes are not formed in the lower mold half 16a2 of the mold 16. Other structural points of the lower mold half are the same as in the lower mold half described in the previous first embodiment. In this embodiment, plural vacuum suction holes 26 are formed in the upper mold half 16b2. The vacuum suction holes 26 are for causing the laminate film 25a to be chucked to the cavity 16c side of the upper mold half 16b2. Planar positions of the vacuum suction holes 26 are about the same as those of the vacuum suction holes (see FIGS. 19 to 22) formed in the lower mold half 16a in the previous first embodiment, for substantially the same reason as that stated previously. That is, the vacuum suction holes 26 are preferably arranged in the outer peripheral portion of the product area of the strip substrate 12. This is for preventing small projections (hole traces) from being formed by the vacuum suction holes 26 in the sealing resin upon vacuum suction in the resin sealing step. In this embodiment, however, all the chips 8 on the strip substrate 12 are sealed together and hence the area of the cavity 16c is large. For this reason, vacuum suction is needed to prevent the occurrence of crease, etc. in the laminate film 25a. For example, the vacuum suction holes 26 may be arranged also in a position corresponding to a central line in the transverse direction of the strip substrate 12. The area on this central line corresponds to a cutting area to be described later and so will be cut. Therefore, even if the foregoing hole traces are formed on the central line just after the sealing step, they will not remain on each semiconductor device 1 obtained finally, or even if they remain, it is possible to make them very small to an extent of not spoiling the appearance. From the standpoint of achieving such an object the upper mold half 16b2 may be formed to have a multi-hole structure or using a porous material so that the upper surface of the laminate film 25a is vacuum-sucked substantially uniformly throughout the whole surface. In this case, since vacuum suction can cover the whole upper surface of the laminate film 25a, it is possible to avoid a lowering in yield of the semiconductor device 1 caused by the aforesaid hole traces. Further, ejector pins are not provided in the upper mold half 16b2. On this regard, a description will be given later. Other structural points of the upper mold half used in this second embodiment are the same as in the previous first embodiment.

Figure 34:
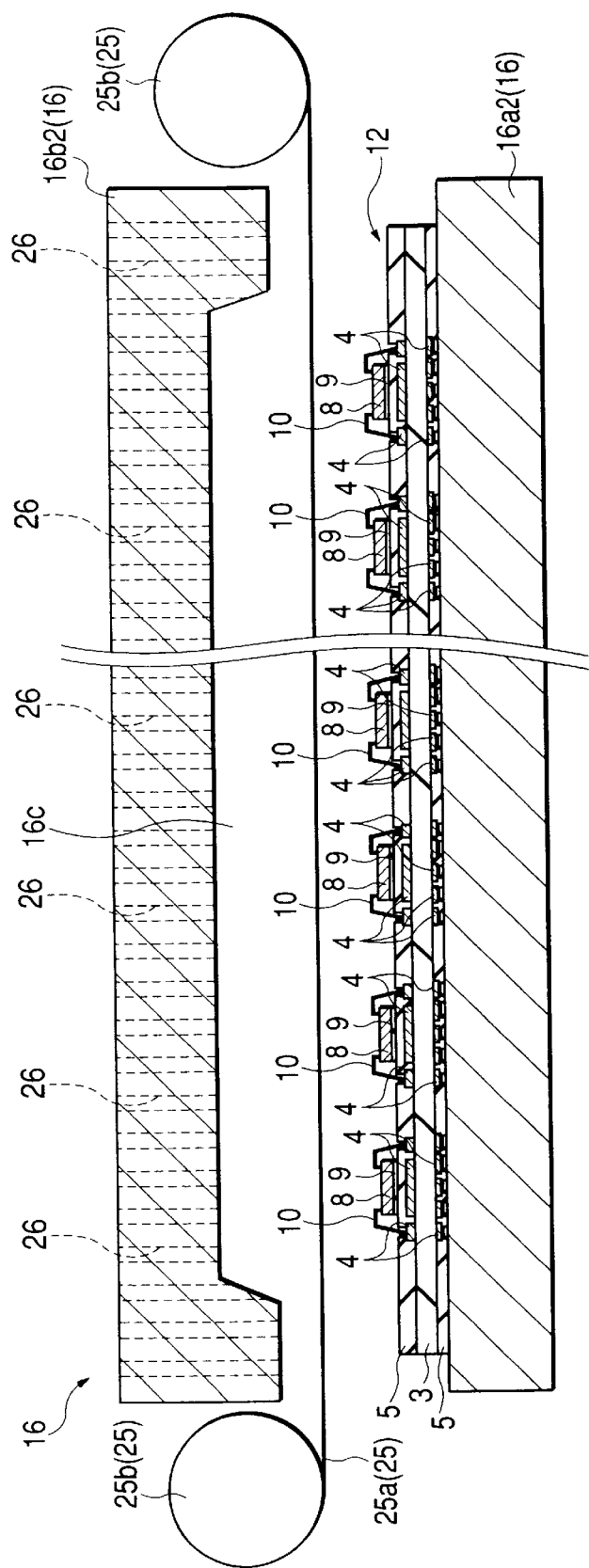
FIG. 34 is a sectional view of the strip substrate being processed in a step which follows FIG. 32.

First, as shown in FIG. 34, the strip substrate 12 is placed on a molding surface of the lower mold half 16a2 of the mold 16 described above and thereafter the strip substrate 12 is preheated for about 20 seconds while setting the temperature of the lower mold half 16a2 at 175° C. for example. This preheat treatment intends to make the strip substrate 12 steady against thermal deformation.

In this embodiment, as noted above, the structure of the strip substrate 12 itself is difficult to undergo the warp, etc. induced by a thermal stress for example. Therefore, when the strip substrate 12 is placed on the mold 16, it is possible to diminish the warp, etc. of the strip substrate which is ascribable to the mechanism of thermal conductivity. Besides, as noted earlier, not only the entire flatness of the strip substrate 12 but also the flatness for each individual semiconductor device forming area DA can be ensured.

Figure 35:
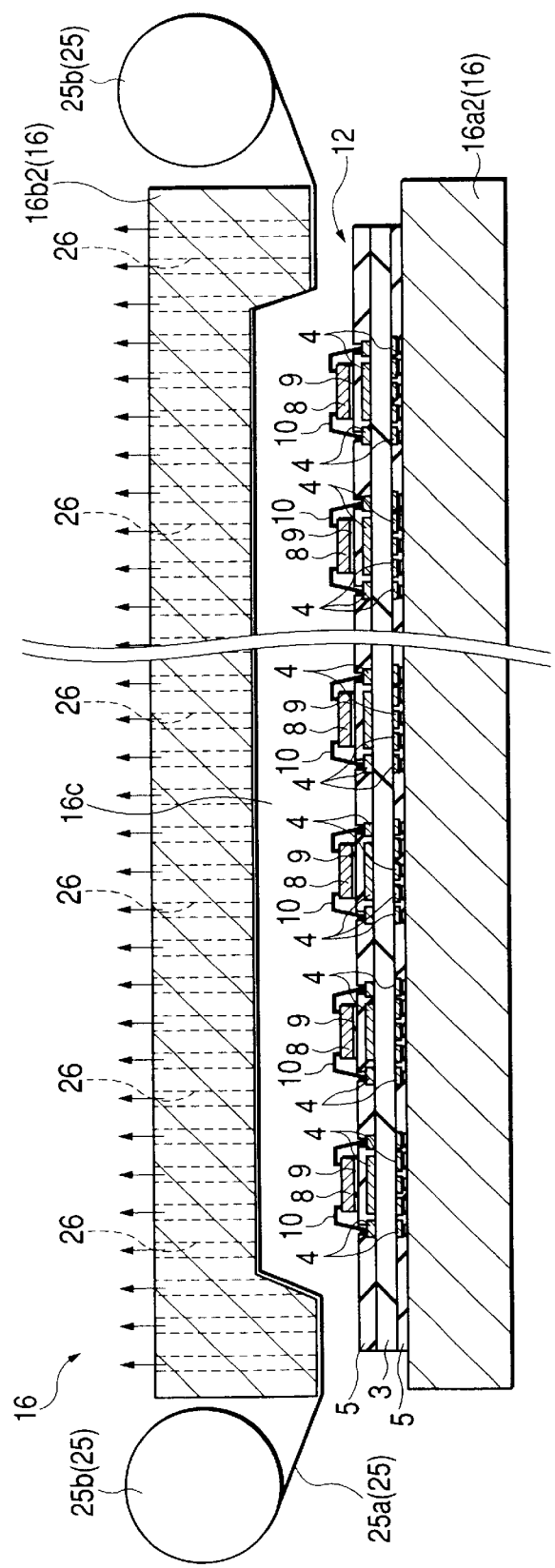
FIG. 35 is a sectional view of the strip substrate being processed in a step which follows FIG. 34.

Next, as shown in FIG. 35, the temperature of the lower and upper mold halves 16a2, 16b2 is set at 175° C. for example and thereafter an upper surface of the laminate film 25a (the surface opposed to the upper mold half 16b2) is chucked by the vacuum suction holes 26, causing the laminate film 25a to come into close contact with the upper mold half 16b2. The arrows affixed to the vacuum suction holes 26 in FIGS. 35, et seq. indicate the direction of vacuum suction.

Figure 36:
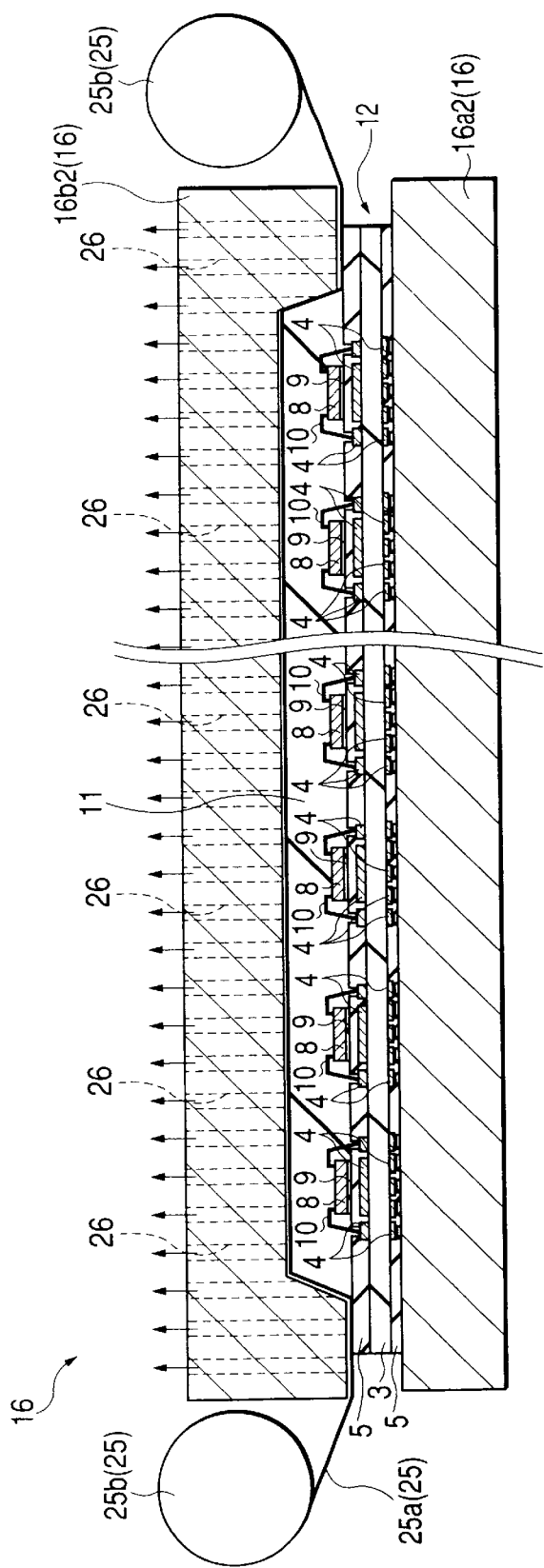
FIG. 36 is a sectional view of the strip substrate being processed in a step which follows FIG. 35.

Then, as shown in FIG. 36, a sealing resin, e.g., an epoxy resin and a low molecular resin, is poured into each cavity 16c of the upper mold half 16b2 while maintaining the above temperature and vacuum suction to seal the plural chips 8 and bonding wires 10 on the main surface of the strip substrate 12 together at a time, thereby forming an integral seal member 11 containing plural chips 8 on the main surface side of the strip substrate 12. Also in this case, as is the case with the previous first embodiment, it is possible to effect a flat resin sealing because the flatness of the strip substrate 12 is high. Consequently, the rate of occurrence of a defective appearance of the semiconductor device 1 can be decreased and therefore it is possible to improve the yield of the semiconductor device. The arrows shown in FIG. 36 indicate the direction of vacuum suction.

Figure 37:
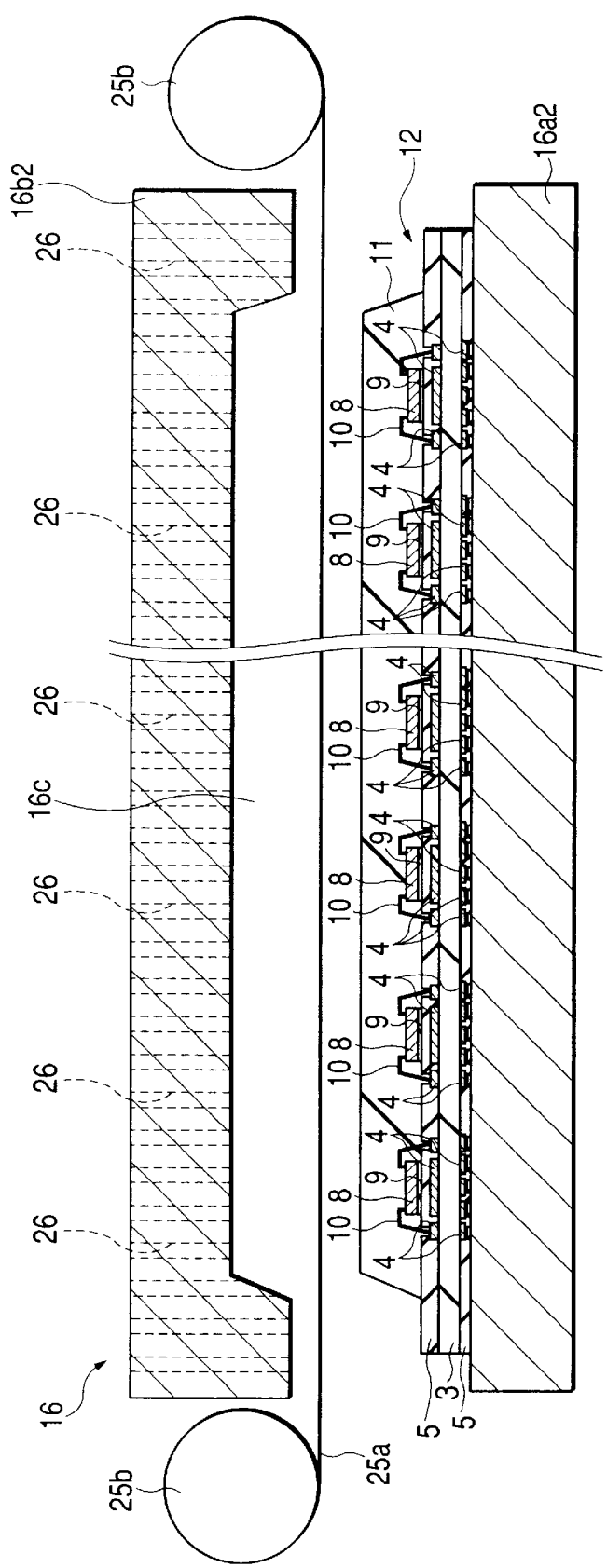
FIG. 37 is a sectional view of the strip substrate being processed in a step which follows FIG. 36.

Subsequently, as shown in FIG. 37, with the lower mold half 16a2 held at the above temperature, the vacuum suction for the laminate film 25a is stopped and the strip substrate 12 having the seal member 11 after the sealing step is taken out from the molt 16 by utilizing the tension of the laminate film 25a. In this case, the laminate film 25a is interposed between the inner wall surface of each cavity 16c of the upper mold half 16b2 and the surface of the seal member 11, that is, the upper mold half 16b2 and the seal member 11 are not in direct contact with each other, and at the time of taking out the seal member 11 from the cavity 16c, force is applied not to points on the surface of the seal member but to the surface. Therefore, with a relatively small force it is possible to separate the seal member 11 from the upper mold half 16b2. Thus, ejector pins for taking out the strip substrate 12 after sealing are not required to be provided in the upper mold half 16b2, that is, the area for ejector pins provided on the strip substrate 12 (seal member 11) side in the previous embodiment can be utilized effectively. Besides, since the releasability between the seal member 11 and the upper mold half 16b2 can be improved, it becomes possible to effect a larger size of resin sealing. Moreover, since the cleaning frequency for the interior of the mold 16 can be decreased, it becomes possible to reduce the semiconductor device manufacturing cost. Subsequent manufacturing steps are the same as in the first embodiment, so explanations thereof will here be omitted.

(Third Embodiment)

Figure 38:
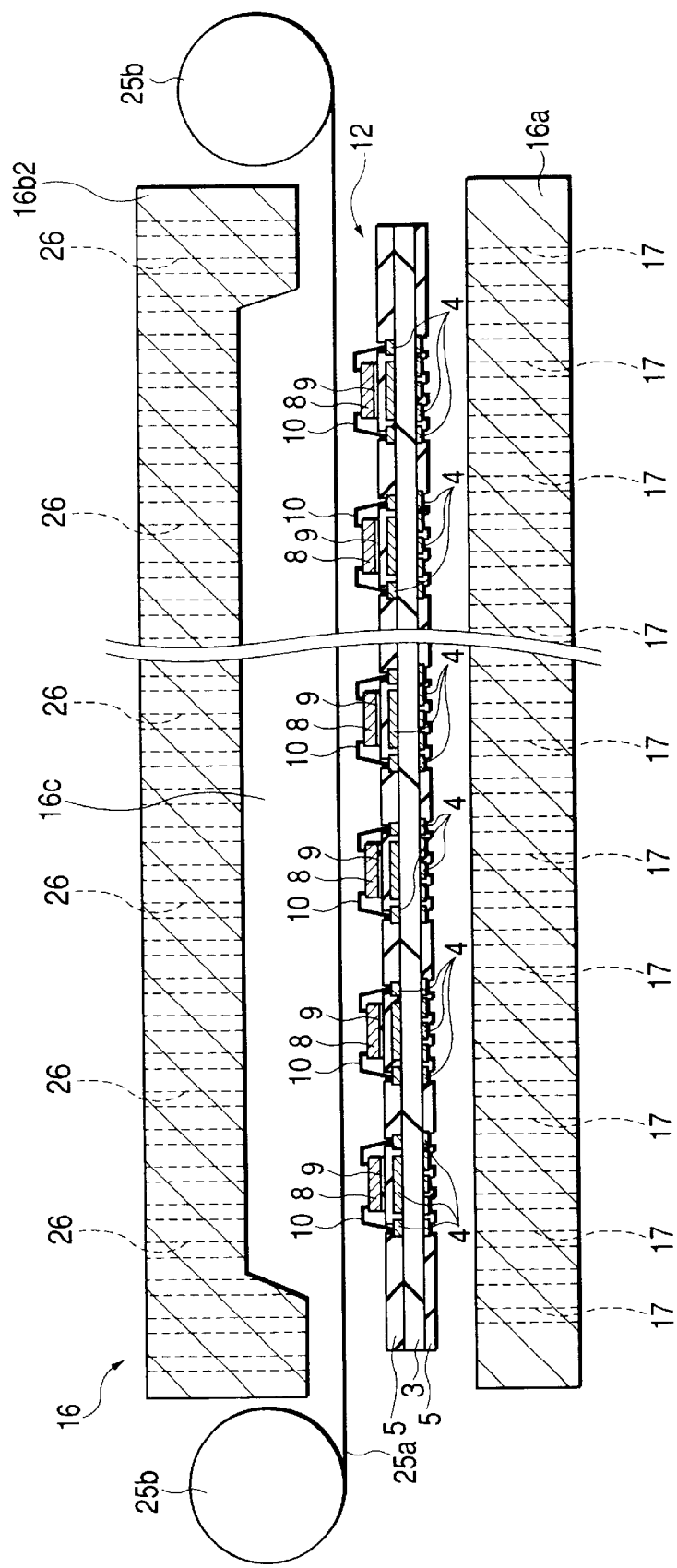
FIG. 38 is a sectional view of a strip substrate used in a semiconductor device manufacturing process further embodying the present invention.

In this third embodiment a further example of a semiconductor manufacturing method according to the present invention will be described. FIG. 38 shows a state in which the strip substrate 12 has been conveyed to a mold 16.

In this third embodiment, the laminate mechanism portion 25 described in the above second embodiment is provided in the mold 16. The structure of a lower mold half 16a of the mold 16 is the same as that described in the previous first embodiment. That is, plural vacuum suction holes 17 are formed in the lower mold half 16a in the same arrangement as in the first embodiment. As to the structure of an upper mold half 16b2 used in this embodiment, it is the same as that used in the second embodiment. That is, plural vacuum suction holes 26 are also formed in the upper mold half 16b2 in the same arrangement as in the second embodiment.

Figure 39:
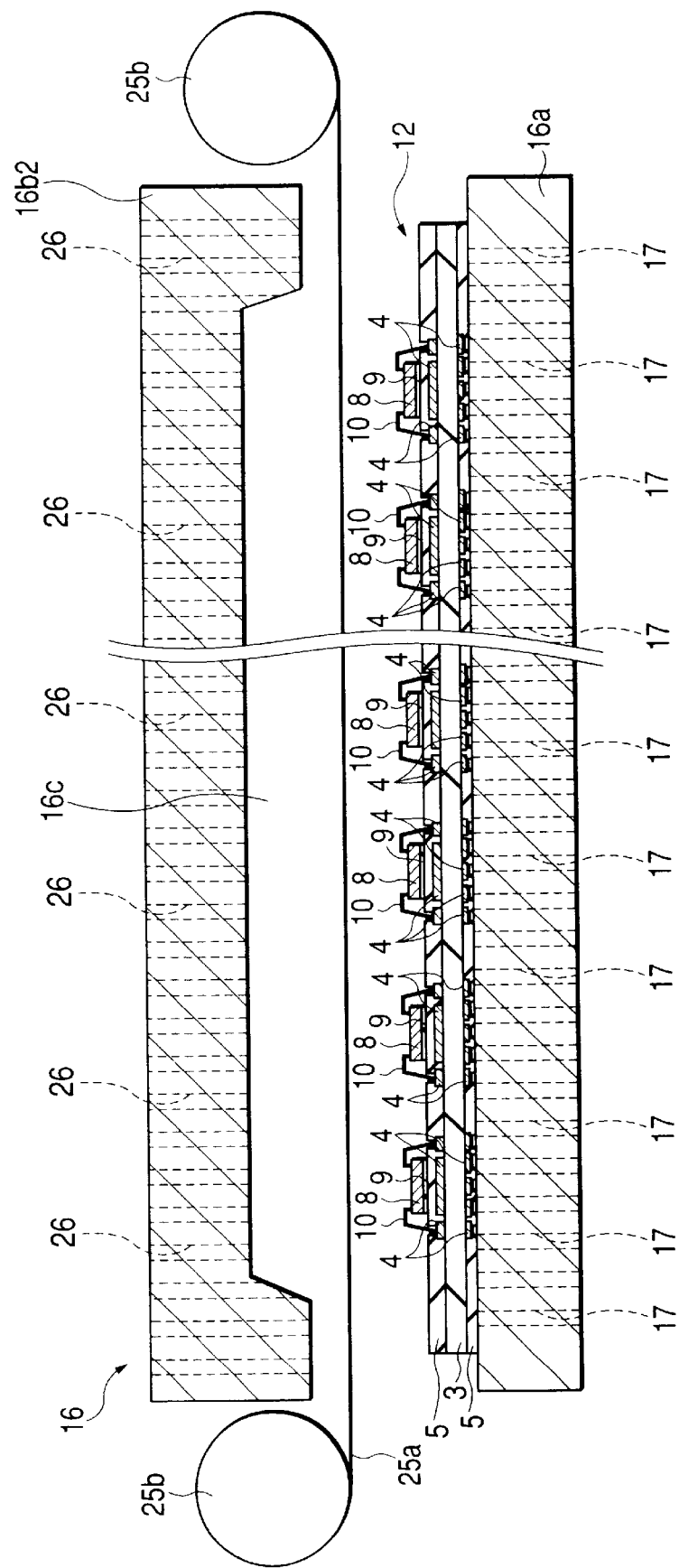
FIG. 39 is a sectional view of the strip substrate being processed in a step which follows FIG. 38.

First, as shown in FIG. 39, the strip substrate 12 is placed on a molding surface of the lower mold half 16a of the mold 16 and then the strip substrate 12 is preheated for about 20 seconds while setting the temperature of the lower mold half 16a2 at 175° C. for example. This preheat treatment intends to make the strip substrate 12 steady against thermal deformation. Also according to this third embodiment, as in the previous first and second embodiments, it is possible to diminish the warp, etc. of the strip substrate 12 and thereby possible to ensure the flatness of the whole of the strip substrate and the flatness for each individual semiconductor device forming area DA.

Figure 40:
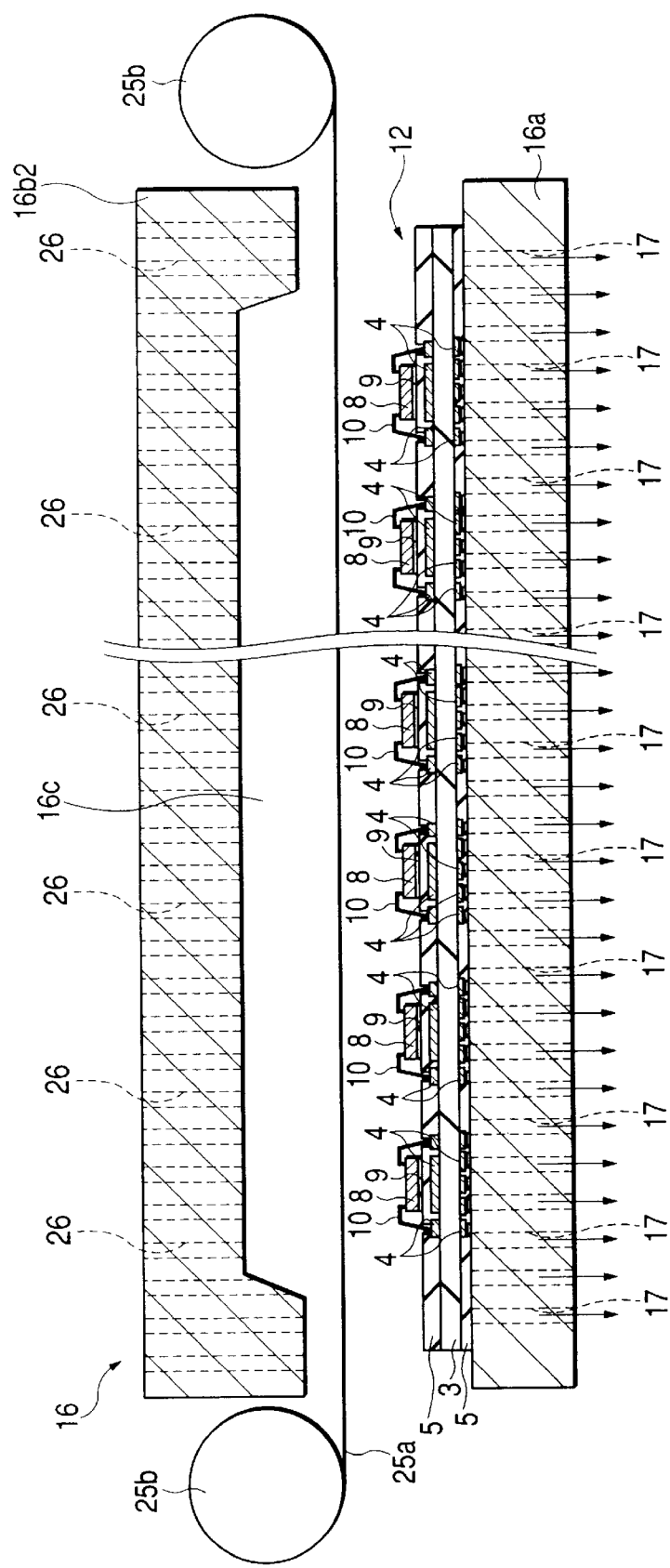
FIG. 40 is a sectional view of the strip substrate being processed in a step which follows FIG. 39.

Next, as shown in FIG. 40, with the temperature of the lower and upper mold halves 16a2, 16b2 set at 175° C. for example, the back side of the strip substrate 12 is sucked by vacuum suction holes 17. At this time, also in this embodiment, the warp, etc. caused by the above heat treatment can be further diminished by sucking the back side of the strip substrate 12 under vacuum in the sealing treatment. Therefore, even if the plane area of the strip substrate further increases to meet a demand for increasing the number of products to be obtained or even if the thickness of the strip substrate becomes smaller to meet a demand for reducing the wall thickness of the semiconductor device, it is possible to effect resin sealing while ensuring the flatness of the whole of the strip substrate 12 and the flatness for each individual semiconductor device forming area DA. The arrows affixed to the vacuum suction holes 17 in FIG. 40 et seq. indicate the direction of vacuum suction.

Figure 41:
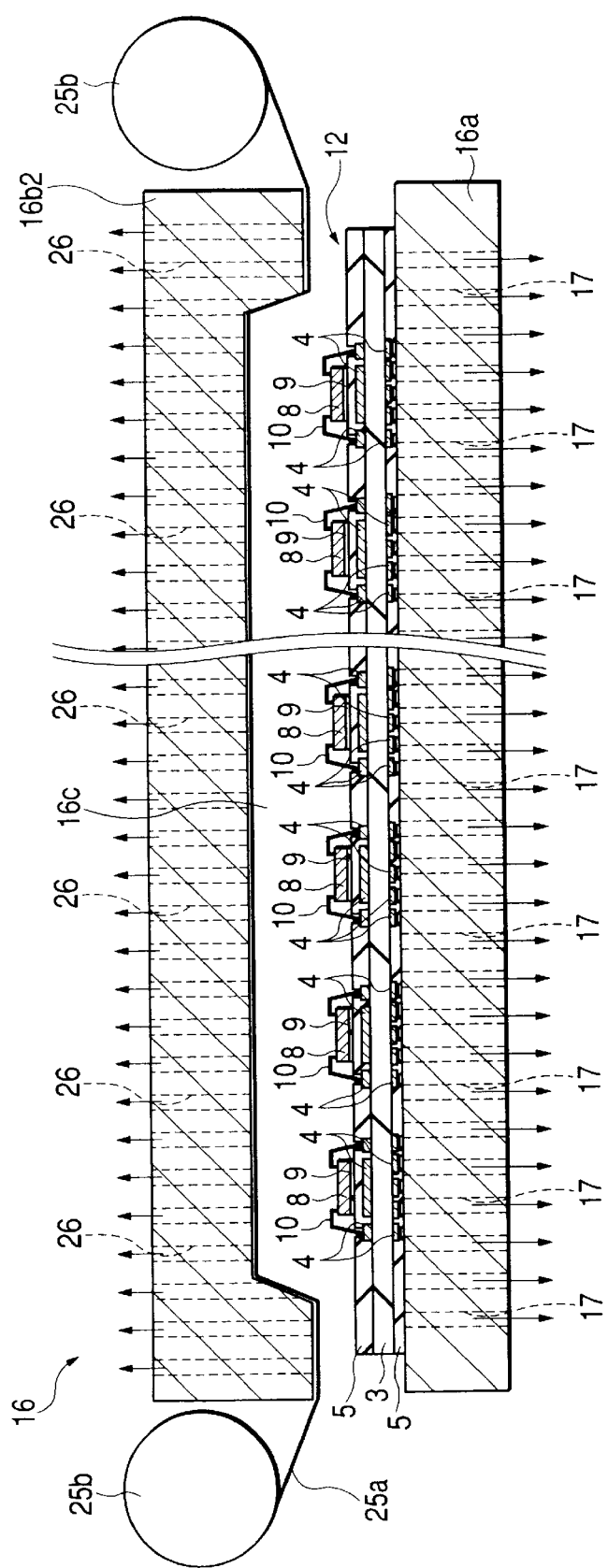
FIG. 41 is a sectional view of the strip substrate being processed in a step which follows FIG. 40.

Subsequently, as shown in FIG. 41, with the temperature of the lower and upper mold halves 16a2, 16b2 set at 175° C. for example and with the lower mold half 16a2 held in the state of vacuum suction, an upper surface (the surface opposed to the upper mold half 16b2) of the laminate film 25a is sucked by the vacuum suction holes 26, causing the laminate film 25a to come into close contact with the upper mold half 16b2. The arrows affixed to the vacuum suction holes 26 in FIGS. 41 et seq. indicate the direction of vacuum suction.

Figure 42:
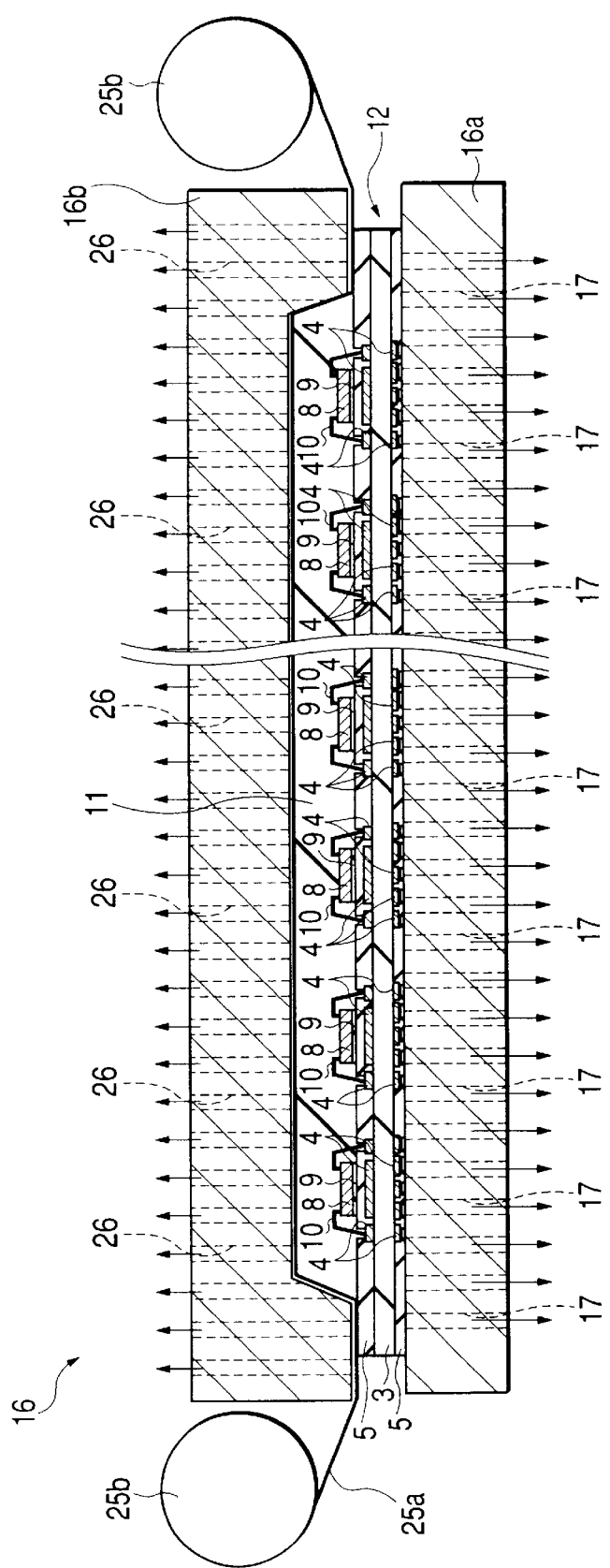
FIG. 42 is a sectional view of the strip substrate being processed in a step which follows FIG. 41.

Then, as shown in FIG. 42, while the above temperature and state of vacuum suction are maintained, a sealing resin, e.g., an epoxy resin and a low molecular resin, is poured into each cavity 16c in the upper mold half 16b2 to seal plural chips 8 on the main surface of the strip substrate 12 and boding wires 10 together at a time, thereby forming an integral seal member 11 which contains plural chips 8 on the main surface side of the strip substrate 12. Also in this embodiment, as in the first embodiment, since the flatness of the strip substrate 12 is high, it is possible to effect a flat resin sealing. Consequently, the rate of occurrence of a defective appearance of the semiconductor device 1 can be decreased and it is thereby possible to improve the yield of the semiconductor device.

Figure 43:
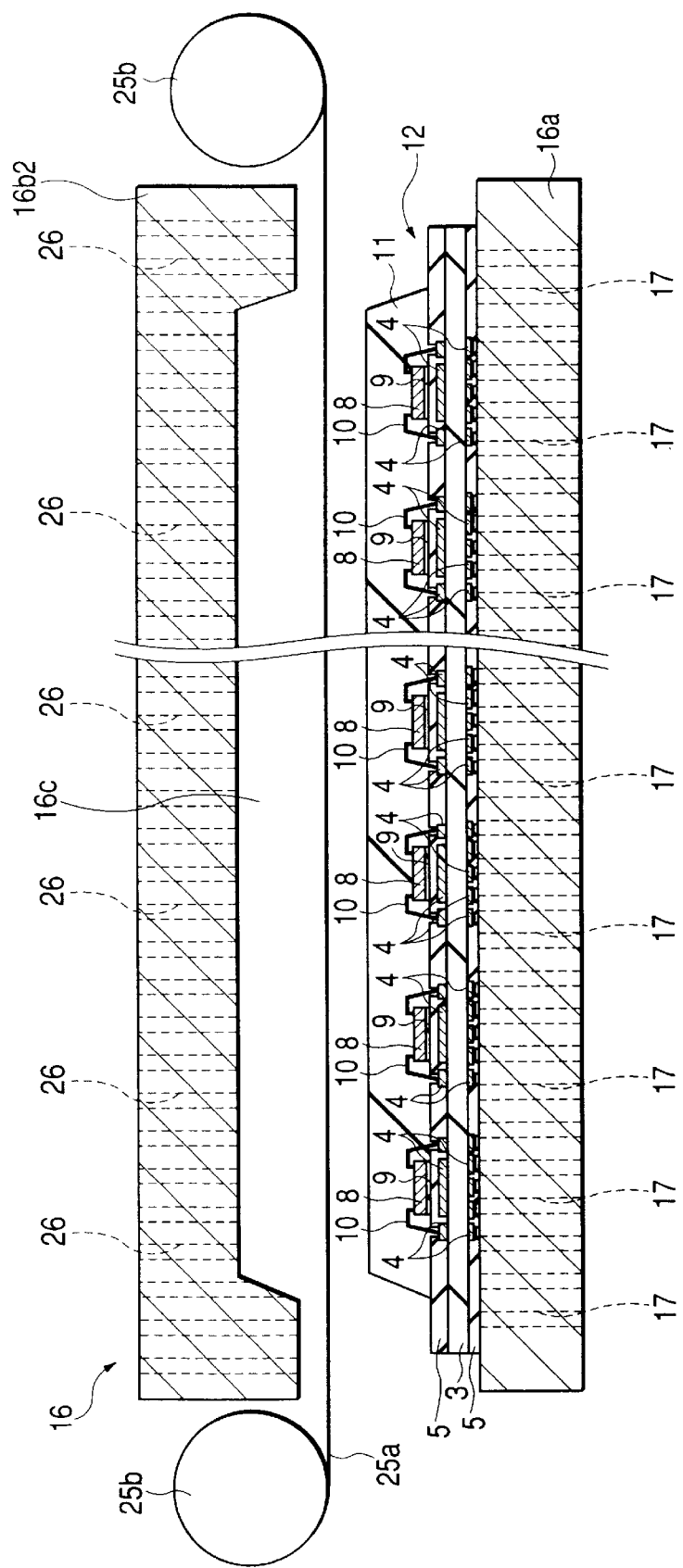
FIG. 43 is a sectional view of the strip substrate being processed in a step which follows FIG. 42.

Next, as shown in FIG. 43 and in the same manner as in the previous second embodiment, with the temperature of the lower mold half 16a2 held at the above temperature, the vacuum suction for the laminate film 25a is stopped and the strip substrate 12 having the seal member 11 after the sealing step is taken out from the mold 16 by utilizing the laminate film 25a. In this case, for the same reason as that set forth in the second embodiment, the seal member 11 can be separated from the upper mold half 16b2 with a relatively small force. Thus, also in this third embodiment the use of ejector pins can be omitted as in the second embodiment and it is possible to effectively utilize the arrangement area of ejector pins. Besides, since the cleaning frequency for the interior of the mold 16 can be decreased, it is possible to reduce the semiconductor manufacturing cost. In this embodiment, moreover, the warp, etc. of the strip substrate 12 induced by heat can be suppressed or prevented and the releasability of the seal member 11 can be improved, so that it is possible to diminish factors which impede an increase in size of the strip substrate 12 and the seal member 11, thus permitting a further increase in size of the strip substrate and the seal member. Thus, an increase in the number of semiconductor devices 1 capable of being obtained from a single strip substrate 12 and an increase in the number of chips capable of being mounted in semiconductor device forming areas can be expected. Consequently, it becomes possible to further reduce the cost of each semiconductor device and further improve the performance thereof. Subsequent steps are the same as in the first embodiment, so explanations thereof will here be omitted.

(Fourth Embodiment)

In this embodiment a description will be given below about modified examples in structure of the semiconductor device described above.

Figure 44:
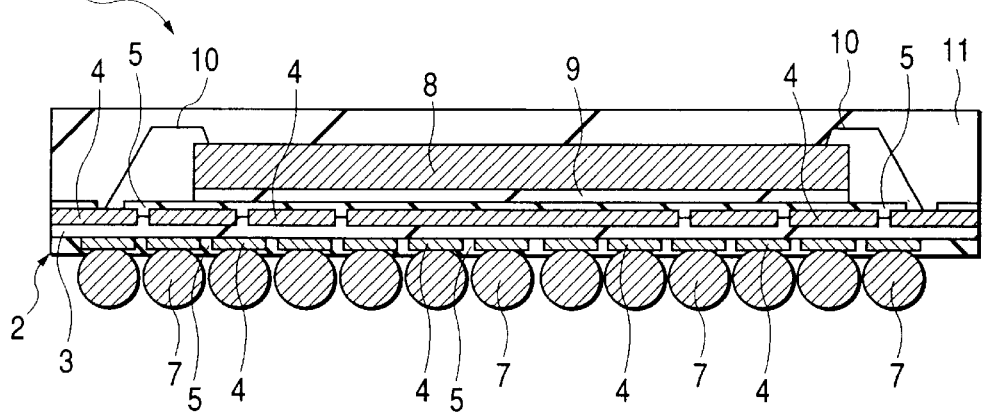
FIG. 44 is a sectional view of a semiconductor device further embodying the present invention.

FIG. 44 is a sectional view of a semiconductor device 1 according to a modified example. In the same figure, a vent hole is not formed and a chip 8 is fixed with an adhesive 9 which is, for example, a hard paste material or a resin paste of the same quality as the sealing resin material so as to be resistive to a high temperature cycle.

Figure 45:
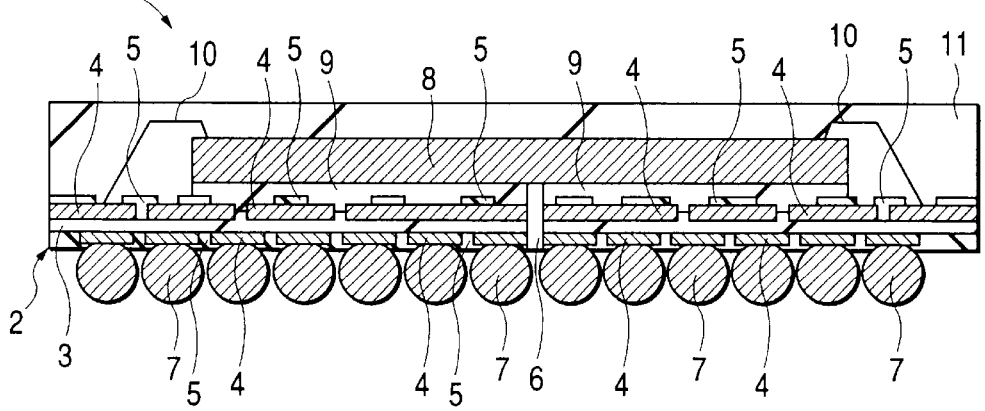
FIG. 45 is a sectional view of a semiconductor device further embodying the present invention.

FIG. 45 is a sectional view of a semiconductor device 1 according to a further modified example. In the same figure, a solder resist 5 is partially removed to make a thermal shrinkage of the solder resist less influential and thereby improve the temperature cyclicity.

(Fifth Embodiment)

In this embodiment a description will be given below about a modified example in structure of the strip substrate described above.

FIG. 46 is a plan view of a strip substrate 12 according to a modified example, in which FIG. 46(a) illustrates a chip mounting surface of the strip substrate 12 and FIG. 46(b) illustrates a package mounting surface on the back side thereof. In FIG. 46 there is used hatching partially to make the drawing easier to see.

In this embodiment, plural reinforcing patterns 13a are dividedly arranged along outer peripheral sides of the strip substrate 12 as in the first embodiment, provided in this embodiment all of reinforcing patterns 13a to 13c (13) are formed as solid patterns. Also in this case, as is the case with the first embodiment, not only a required mechanical strength of the strip substrate 12 can be ensured, but also warp and distortion induced by heat treatment in the manufacture of the semiconductor device 1 can be suppressed and the flatness of the strip substrate can be ensured. In the sealing step, therefore, sealing can be done to a satisfactory extent and it is possible to improve the yield of the semiconductor device 1. Besides, since the reinforcing patterns 13a are arranged dividedly, a thermal stress, which is exerted relatively strongly between adjacent semiconductor device forming areas DA on the strip substrate 12 can be dispersed and relieved as in the first embodiment, thus making it possible to ensure an entire flatness of the strip substrate 12. Moreover, it is possible to suppress or prevent the reinforcing patterns 13a from undergoing a residual image strain. Further, since it is possible to ensure flatness for each semiconductor device forming area DA on the strip substrate 12, it is possible to effect resin sealing to a satisfactory extent and improve the yield of the semiconductor device 1. Additionally, since the reinforcing patterns 13a are not present on a cutting line of the strip substrate 12, it is possible to prevent the occurrence of a conductor foreign matter (burr) of the reinforcing patterns 13a at the time of cutting the strip substrate 12 and hence possible to prevent the occurrence of a short-circuit fault or the like caused by the presence of such a foreign matter.

(Sixth Embodiment)

In this embodiment a description will be given below about a further modified example in structure of the strip substrate. FIG. 47 is a plan view of a strip substrate 12 according to a further modified example, in which FIG. 47(a) illustrates a chip mounting surface of the strip substrate 12 and FIG. 47(b) illustrates a package mounting surface on the back side thereof. In FIG. 47 there is used hatching partially to make the drawing easier to see.

In this embodiment, reinforcing patterns 13d (13) are arranged along peripheral long sides on both main surface and back side of the strip substrate 12, while reinforcing patterns 13e (13) are arranged along peripheral short sides on both main surface and back side of the strip substrate.

The reinforcing patterns 13d are not divided between adjacent semiconductor device forming areas DA, but are extended in the longitudinal direction of the strip substrate 12. As in the first embodiment the reinforcing patterns 13d are formed in a tile shape. But also in this case the shape of the reinforcing patterns 13d is not limited to the tile shape. Various changes may be made insofar as the reinforcing patterns have a structure capable of expansion and construction. For example, the reinforcing patterns 13d may be formed in a dot shape as referred to in the first embodiment. The reinforcing patterns 13e are extended in the transverse direction of the strip substrate 12 and are also in the shape of a tile. The reinforcing patterns 13d and 13e are formed of the same conductor material (e.g., copper foil) as that of the reinforcing patterns 13a used in the first embodiment.

According to this sixth embodiment, not only it is possible to ensure a required mechanical strength of the strip substrate 12, but also by forming the reinforcing patterns 13d so as to have a structure capable of expansion and contraction in the foregoing heat treatment it is made possible to relax a thermal stress induced by the heat treatment in the semiconductor manufacturing process; besides, the occurrence of a residual image strain can be suppressed or prevented, so that the flatness of the strip substrate 12 can be further improved.

Although the present invention has been described above concretely by way of embodiments thereof, it goes without saying that the invention is not limited to the above embodiments, but that various changes may be made within the scope not departing from the gist of the invention.

For example, although in the above first to third, fifth and sixth embodiments a single vent hole is formed centrally of the package substrate (semiconductor device forming area), no limitation is made thereto, but plural vent holes may be provided.

Although in the first embodiment the strip substrate is vacuum-chucked to the lower mold half at the time of resin-sealing plural semiconductor chips together, the ordinary resin sealing may be conducted without performing such vacuum suction. In this case, since the strip substrate is of a structure highly resistant to a thermal stress, it is possible to effect resin-sealing while ensuring the flatness of the strip substrate.

Although the invention accomplished by the present invention has been described above mainly with respect to the application thereof to the FBGA type semiconductor device as the background application field of the invention, no limitation is made thereto, but the invention is also applicable to, for example, CSP, BGA, and LGA (Land Grid Array) type semiconductor devices and methods for manufacturing them.

A brief description will be given below about effects obtained by typical inventions out of those disclosed herein.

(1) According to the present invention, a first substrate with plural semiconductor chips mounted on a first surface thereof is set within a mold, then the plural semiconductor chips are together sealed with resin to form a seal member, and thereafter the first substrate and seal member released from the mold are cut into plural semiconductor devices, whereby the number of products obtained per unit area can be increased and hence it becomes possible to reduce the semiconductor device manufacturing cost.

(2) According to the present invention, since the first substrate is formed mainly by an insulating material equal in thermal expansion coefficient to a second substrate as a mounting substrate for the first substrate, it becomes possible to improve the reliability of the semiconductor device.

What is claimed is:

1. A method of manufacturing a semiconductor device, comprising the steps of:

(a) providing a substrate having a main surface, a rear surface opposed to the main surface, wirings formed on the main surface, and a plurality of semiconductor device forming areas arranged on each of the main and rear surfaces thereof;

(b) providing a plurality of semiconductor chips each having a main surface, a rear surface opposed to the main surface, and electrodes formed on the main surface;

(c) mounting the plurality of semiconductor chips on the plurality of semiconductor device forming areas on the main surface of the substrate, respectively;

(d) after the step (c), electrically connecting electrodes of the plurality of semiconductor chips with the wirings of the substrate by wires;

(e) providing a mold having an upper mold half, a lower mold half and a cavity formed in the upper mold half;

(f) after the step (d), setting the substrate with the plurality of semiconductor chips mounted thereon into a mold so that the rear surface of the substrate faces the lower mold half and so that the plurality of semiconductor chips are received into the cavity;

(g) after step (f), sealing the plurality of semiconductor chips with resin in block to form a seal member by injecting the resin into the cavity while allowing the rear surface of the substrate to be vacuum-chucked to the lower mold half of the mold; and (h) cutting the substrate and the seal member into individual semiconductor devices, wherein the substrate has dummy conductor patterns, and wherein the plurality of semiconductor chips are arranged so as to overlap the dummy conductor patterns in plan view.

2. A method of manufacturing a semiconductor device according to claim 1, wherein step (g) includes the steps of sealing the plurality of semiconductor chips with resin while interposing a film between the upper mold half of the mold and the main surface of the substrate, and allowing the film to be vacuum-chucked to the upper mold half of the mold.

3. A method of manufacturing a semiconductor device according to claim 2, wherein the dummy conductor patterns have first dummy conductor patterns formed on the main surface of the substrate and second dummy conductor patterns formed on the rear surface of the substrate.

4. A method of manufacturing a semiconductor device according to claim 3, wherein each conductor pattern of the first dummy conductor patterns is arranged so as to overlap a corresponding conductor pattern of the second dummy conductor patterns.

5. A method of manufacturing a semiconductor device according to claim 4, wherein each of the plurality of semiconductor chips is arranged so as to overlap a corresponding conductor pattern of the first dummy conductor patterns and a corresponding conductor pattern of the second dummy conductor patterns.

6. A method of manufacturing a semiconductor device, comprising the steps of:

(a) providing a substrate having a main surface, a rear surface opposed to the main surface, wirings formed on the main surface, and a plurality of semiconductor device forming areas arranged on each of the main and rear surfaces thereof;

(b) providing a plurality of semiconductor chips each having a main surface, a rear surface opposed to the main surface, and electrodes formed on the main surface;

(c) mounting the plurality of semiconductor chips on the plurality of semiconductor device forming areas on the main surface of the substrate, respectively;

(d) after the step (c), electrically connecting electrodes of the plurality of semiconductor chips with the wirings of the substrate by wires;

(e) providing a mold having an upper mold half, a lower mold half and a cavity formed in the upper mold half;

(f) after the step (d), setting the substrate with the plurality of semiconductor chips mounted thereon into a mold so that the rear surface of the substrate faces the lower mold half and so that the plurality of semiconductor chips are received into the cavity;

(g) after the step (f), sealing the plurality of semiconductor chips with resin in block to form a seal member by injecting the resin into the cavity while allowing the rear surface of the substrate to be vacuum-chucked to the lower mold half of the mold; and (h) cutting the substrate and the seal member into individual semiconductor devices, wherein the substrate has conductor patterns that are electrically isolated from the plurality of semiconductor chips and arranged on the semiconductor device forming areas, and wherein the plurality of semiconductor chips are arranged so as to overlap the conductor patterns of the substrate in plan view.

7. A method of manufacturing a semiconductor device according to claim 6, wherein step (g) further comprises the steps of sealing the plurality of semiconductor chips with resin while interposing a film between the upper mold half of the mold and the main surface of the substrate, and allowing the film to be vacuum-chucked to the upper mold half of the mold.

8. A method of manufacturing a semiconductor device according to claim 7, wherein the conductor patterns of the substrate have first conductor patterns formed on the main surface of the substrate and second conductor patterns formed on the rear surface of the substrate, and each of the first conductor patterns and each of the second conductor patterns is electrically isolated from the plurality of semiconductor chips.

9. A method of manufacturing a semiconductor device according to claim 8, wherein each conductor pattern of the first conductor patterns is arranged so as to overlap a corresponding conductor pattern of the second conductor patterns.

10. A method of manufacturing a semiconductor device according to claim 9, wherein each of the plurality of semiconductor chips is arranged so as to overlap a corresponding conductor pattern of the first conductor patterns and corresponding conductor pattern of the second conductor patterns.

11. A method of manufacturing a semiconductor device, comprising the steps of:

(a) providing a substrate having a main surface, a rear surface opposed to the main surface, wirings formed on the main surface, and a plurality of semiconductor device forming areas arranged on each of the main and rear surfaces thereof;

(b) providing a plurality of semiconductor chips each having a main surface, a rear surface opposed to the main surface, and electrodes formed on the main surface;

(c) mounting the plurality of semiconductor chips on the plurality of semiconductor device forming areas on the main surface of the substrate, respectively;

(d) after the step (c), electrically connecting electrodes of the plurality of semiconductor chips with the wirings of the substrate by wires;

(e) providing a mold having an upper mold half, a lower mold half and a cavity formed in the upper mold half;

(f) after the step (d), setting the substrate with the plurality of semiconductor chips mounted thereon into a mold so that the rear surface of the substrate faces the lower mold half and so that the plurality of semiconductor chips are received into the cavity;

(g) after the step (f), sealing the plurality of semiconductor chips with resin in block to form a seal member by injecting the resin into the cavity while allowing the rear surface of the substrate to be vacuum-chucked to the lower mold half of the mold; and (h) cutting the substrate and the seal member into individual semiconductor devices, wherein the substrate has reinforcing conductor patterns arranged at the outside of the semiconductor device forming areas.

12. A method of manufacturing a semiconductor device according to claim 11, wherein step (g) further comprises the steps of sealing the plurality of semiconductor chips with resin while interposing a film between the upper mold half of the mold and the main surface of the substrate, and allowing the film to be vacuum-chucked to the upper mold half of the mold.

13. A method of manufacturing a semiconductor device according to claim 12, wherein the reinforcing conductor patterns have first reinforcing conductor patterns formed on the main surface of the substrate and second reinforcing conductor patterns formed on the rear surface of the substrate.

14. A method of manufacturing a semiconductor device according to claim 13, wherein each conductor pattern of the first reinforcing conductor patterns is arranged so as to overlap a corresponding conductor pattern of the second reinforcing conductor patterns.

15. A method of manufacturing a semiconductor device according to claim 14, wherein each of the plurality of semiconductor chips is arranged so as to overlap a corresponding conductor pattern of the first reinforcing conductor patterns and a corresponding conductor pattern of the second reinforcing conductor patterns.

16. A method of manufacturing a semiconductor device according to claim 12, wherein the substrate has dummy conductor patterns, and wherein the plurality of semiconductor chips are arranged so as to overlap the dummy conductor patterns in plan view.

17. A method of manufacturing a semiconductor device, comprising the steps of:

(a) providing a substrate having a main surface, a rear surface opposed to the main surface, wirings formed on the main surface, and a plurality of semiconductor device forming areas arranged on each of the main and rear surfaces thereof;

(b) providing a plurality of semiconductor chips each having a main surface, a rear surface opposed to the main surface, and electrodes formed on the main surface;

(c) mounting the plurality of semiconductor chips on the plurality of semiconductor device forming areas on the main surface of the substrate, respectively;

(d) after the step (c), electrically connecting electrodes of the plurality of semiconductor chips with the wirings of the substrate by wires;

(e) providing a mold having an upper mold half, a lower mold half and a cavity formed in the upper mold half;

(f) after the step (d), setting the substrate with the plurality of semiconductor chips mounted thereon into a mold so that the rear surface of the substrate faces the lower mold half and so that the plurality of semiconductor chips are received into the cavity;

(g) after the step (f), sealing the plurality of semiconductor chips with resin in block to form a seal member by injecting the resin into the cavity while allowing the rear surface of the substrate to be vacuum-chucked to the lower mold half of the mold; and (h) cutting the substrate and the seal member into individual semiconductor devices, wherein the substrate has conductor patterns that are electrically isolated from the plurality of semiconductor chips and arranged at the outside of the semiconductor device forming areas.

18. A method of manufacturing a semiconductor device according to claim 17, wherein step (g) further comprises the steps of sealing the plurality of semiconductor chips with resin while interposing a film between the upper mold half of the mold and the main surface of the substrate, and allowing the film to be vacuum-chucked to the upper mold half of the mold.

19. A method of manufacturing a semiconductor device according to claim 18, wherein the conductor patterns at the outside of the semiconductor device forming areas have first conductor patterns formed on the main surface of the substrate and second conductor patterns formed on the rear surface of the substrate.

20. A method of manufacturing a semiconductor device according to claim 19, wherein each conductor pattern of the first conductor patterns is arranged so as to overlap a corresponding conductor pattern of the second conductor patterns.

21. A method of manufacturing a semiconductor device according to claim 20, wherein each of the plurality of semiconductor chips is arranged so as to overlap a corresponding conductor pattern of the first conductor patterns and a corresponding pattern of the second conductor patterns.

22. A method of manufacturing a semiconductor device according to claim 21, wherein the substrate has conductor patterns that are electrically isolated from the plurality of semiconductor chips and arranged on the semiconductor device forming areas, and wherein the plurality of semiconductor chips are arranged so as to overlap the conductor patterns of the substrate in plan view.

* * * * *